United States Patent
Cui et al.

(10) Patent No.: US 12,181,519 B2
(45) Date of Patent: Dec. 31, 2024

(54) CHIP TEST CIRCUIT AND CIRCUIT TEST METHOD

(71) Applicant: HUAWEI TECHNOLOGIES CO., LTD., Guangdong (CN)

(72) Inventors: Changming Cui, Shenzhen (CN); Junlin Huang, Shenzhen (CN); Yu Huang, Shenzhen (CN); Haitao Fu, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 164 days.

(21) Appl. No.: 18/175,306

(22) Filed: Feb. 27, 2023

(65) Prior Publication Data

US 2023/0204660 A1 Jun. 29, 2023

Related U.S. Application Data

(63) Continuation of application No. PCT/CN2020/112660, filed on Aug. 31, 2020.

(51) Int. Cl.
*G01R 31/317* (2006.01)
*G01R 31/3185* (2006.01)

(52) U.S. Cl.
CPC ... *G01R 31/3172* (2013.01); *G01R 31/31722* (2013.01); *G01R 31/318544* (2013.01); *G01R 31/318572* (2013.01)

(58) Field of Classification Search
None
See application file for complete search history.

(56) References Cited

U.S. PATENT DOCUMENTS 6,421,810 B1 * 7/2002 McCown .......... G01R 31/31723
716/136
6,633,502 B2 * 10/2003 Iwasaki .......... G01R 31/318536
365/201

(Continued)

FOREIGN PATENT DOCUMENTS

CN 201434901 Y 3/2010
CN 101923133 A 12/2010

(Continued)

OTHER PUBLICATIONS

Dong et al., "Maximizing Scan Pin and Bandwidth Utilization with a Scan Routing Fabric," 2017 IEEE International Test Conference (ITC), Oct. 31-Nov. 2, 2017, 10 pages.

(Continued)

*Primary Examiner* — Jermele M Hollington
(74) *Attorney, Agent, or Firm* — Fish & Richardson P.C.

(57) ABSTRACT

This disclosure provides methods and apparatuses for testing a tested circuit. In an implementation, a chip test circuit transmits input data of a test vector to a data distribution circuit through an input of a test bus, and transmits the input data of the test vector to a scan input channel of a tested circuit through the data distribution circuit. After scanning of the tested circuit ends, output data of the test vector of the scan output channel of the tested circuit is transmitted to an output of the test bus through the data distribution circuit to complete the test of the tested circuit. A dynamic correspondence between the data distribution circuit and the test bus is implemented by configuring a first selector, so that test resources can be dynamically allocated.

20 Claims, 20 Drawing Sheets

(56) References Cited

U.S. PATENT DOCUMENTS

| | | | |
|---|---|---|---|
| 8,103,924 B2 | 1/2012 | Giles et al. | |
| 9,088,522 B2 | 7/2015 | Rajski et al. | |
| 10,476,740 B1 | 11/2019 | Cote et al. | |
| 2009/0210759 A1* | 8/2009 | Singhal | G11C 29/32 |
| | | | 714/E11.155 |
| 2016/0306011 A1 | 10/2016 | Athimolom et al. | |
| 2020/0174070 A1* | 6/2020 | Schat | G01R 31/318552 |
| 2023/0204661 A1* | 6/2023 | Huang | G01R 31/318544 |
| | | | 324/537 |

FOREIGN PATENT DOCUMENTS

| | | | | |
|---|---|---|---|---|
| CN | 104122497 A | | 10/2014 | |
| CN | 105486999 A | | 4/2016 | |
| CN | 105911454 A | | 8/2016 | |
| CN | 115443413 A | * | 12/2022 | ......... G01R 31/3172 |
| JP | 2010081009 A | | 4/2010 | |

OTHER PUBLICATIONS

International Search Report and Written Opinion in International Appln. No. PCT/CN2020/112660, mailed on Apr. 27, 2021, 16 pages (with English translation).

\* cited by examiner

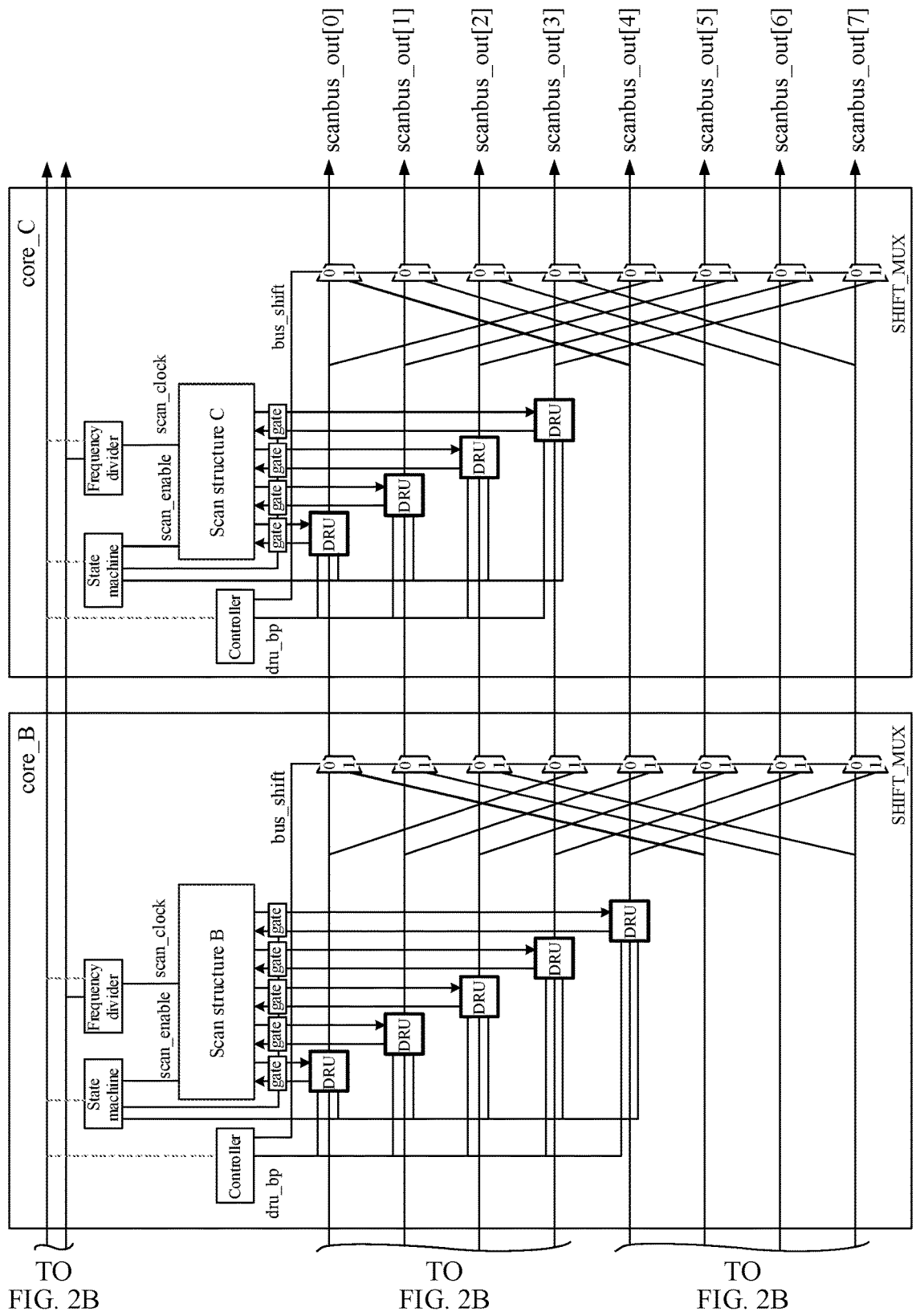

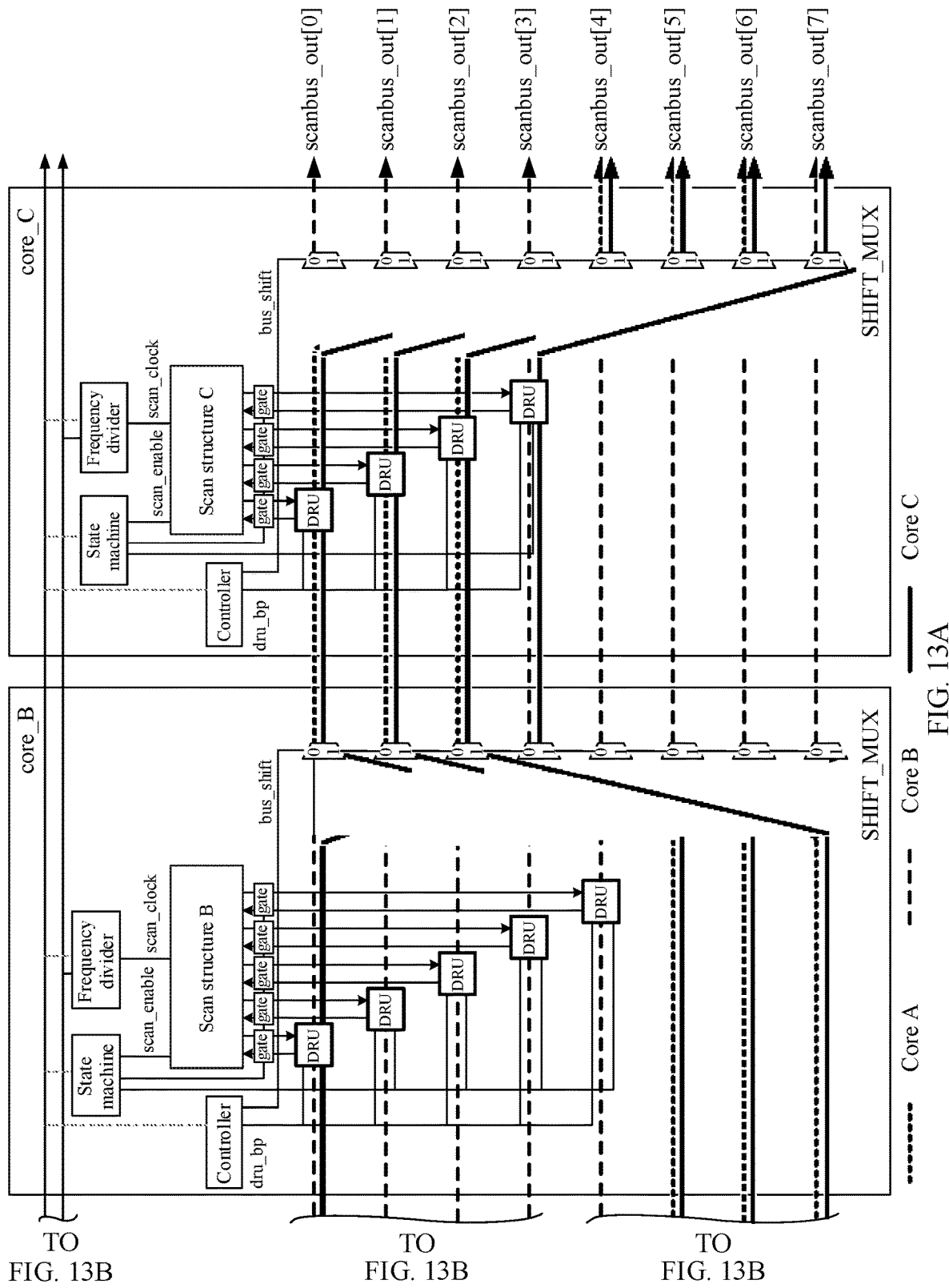

CHIP TEST CIRCUIT AND CIRCUIT TEST METHOD

CROSS-REFERENCE TO RELATED APPLICATIONS

This application is a continuation of International Application No. PCT/CN2020/112660, filed on Aug. 31, 2020, the disclosure of which is hereby incorporated by reference in its entirety.

TECHNICAL FIELD

This application relates to the field of electronic technologies, and in particular, to a test circuit in a chip and a circuit test method.

BACKGROUND

With the development of semiconductor technologies, a size of a system on chip (system on a chip, SoC) becomes larger and larger, and there are more and more circuit modules inside the system on chip. When a circuit module in the system on chip is tested, because resources that can be used for testing are limited, for example, chip pins are limited, the limited resources need to be properly planned and reused, to implement a large-scale test requirement. To resolve the foregoing problem, currently used solutions include a scan routing fabric (SRF) and a scan streaming network (SSN).

In the SRF solution, multiplexing is performed on a small quantity of chip pins by using a multiplexer (MUX), so that a circuit with a larger quantity of test scan channels can be tested. If a quantity of scan channels of a to-be-tested circuit continuously increases, a serious winding congestion problem occurs, and test costs are high. In the SSN solution, scan test data is transmitted through a bus. During transmission, test data is exchanged between the bus and a test compress lion logic of the to-be-tested circuit through a complex hardware circuit. When a quantity of to-be-tested circuit increases, a quantity of hardware circuits used for data exchange also increases. As a result, a size of the hardware circuit is large. In addition, in the SSN solution, a complex hardware circuit needs to be configured. A configuration process is complex and test efficiency is low.

SUMMARY

Embodiments of this application provide a chip test circuit and a circuit test method, to resolve problems of winding congestion and complex test configuration in an existing test solution, to reduce test costs and improve test efficiency.

To achieve the foregoing objective, this application uses the following technical solutions.

According to a first aspect, a test circuit is provided. The test circuit includes a plurality of test subcircuits respectively corresponding to a plurality of tested circuits. The plurality of test subcircuits are configured to respectively connect the corresponding tested circuits to a test bus. Each tested circuit corresponds to a test subcircuit. Each test subcircuit may transmit data required for test scanning to a scan input channel of a corresponding tested circuit through the test bus, and transmit test result data of a corresponding tested circuit to the test bus for output. Each test subcircuit may also dynamically allocate the test bus to the corresponding tested circuit. A $j^{th}$ test subcircuit in the plurality of test subcircuits includes Nj data distribution circuits and M first selectors. Nj and M are both positive integers. M is equal to a bit width of the test bus. M is greater than or equal to Nj. The $j^{th}$ test subcircuit may be any one of the plurality of test subcircuits. The data distribution circuit is configured to receive scan test data of the test bus and transmit the scan test data to the scan input channel of the tested circuit, and receive test result data of a scan output channel of the tested circuit and transmit the test result data to the test bus for output. In the $j^{th}$ test subcircuit, a connection relationship between the data distribution circuit, the test bus, and the tested circuit is: First input ends of the Nj data distribution circuits are respectively connected to Nj inputs of the test bus, and are configured to receive the scan test data of the test bus. First output ends of the Nj data distribution circuits are connected to a scan input channel of the tested circuit corresponding to the $j^{th}$ test subcircuit, and are configured to transmit the scan test data received by the data distribution circuit to the scan input channel of the tested circuit. Second input ends of the Nj data distribution circuits are connected to a scan output channel of the tested circuit corresponding to the $j^{th}$ test subcircuit, and configured to transmit the test result data of the tested circuit to the output of the test bus through the data distribution circuit after the test result data of the circuit under test is transmitted to the data distribution circuit. The first selector may be an alternative selector, and is configured to select a test bus used by a $(j+1)^{th}$ test subcircuit, to implement dynamic allocation of the test bus. Specifically, output ends of the M first selectors are respectively connected to M outputs of the test bus, and the M first selectors in each test subcircuit are respectively corresponding to M bits of the test bus. First input ends of Nj first selectors of the M first selectors are respectively connected to second output ends of the Nj data distribution circuits. First input ends of remaining M-Nj first selectors are respectively connected to inputs of M-Nj test buses on which no data distribution circuit is disposed. Second input ends of Nj first selectors of the M first selectors are respectively connected to the second output ends of the Nj data distribution circuits. Second input ends of the remaining M-Nj first selectors are respectively connected to the inputs of the M-Nj test buses on which no data distribution circuit is disposed. In addition, the test buses connected to the first input end and the second input end of each first selector are different. In the $j^{th}$ test subcircuit, the test buses connected to the first input end and the second input end of the first selector are different. The test bus used by the $(j+1)^{th}$ test subcircuit may be configured by using the first selector.

Based on the test circuit provided in the first aspect, the test circuit transmits input data of a test vector, that is, the scan test data, to the data distribution circuit through the input of the test bus, and transmits the input data of the test vector to the scan input channel of the tested circuit through the data distribution circuit. After scanning of the tested circuit ends, output data of the test vector of the scan output channel of the tested circuit, that is, the test result data, is transmitted to the output of the test bus through the data distribution circuit to complete the test of the tested circuit. A dynamic correspondence between the data distribution circuit and the test bus is implemented by configuring the first selector, so that test resources can be dynamically allocated. For example, it is assumed that a bit width of the test bus is 8 bits, a quantity of data distribution circuits used in a first test subcircuit is 3, and a quantity of second data distribution circuits is 5. Three data distribution circuits in the first test subcircuit are respectively connected to bits [0], [1], and [2] of the test bus. Four data distribution circuits in a second test subcircuit are respectively connected to bits [0], [1], [2], [3], and [4] of the test bus. Outputs of eight first selectors are respectively connected to eight outputs of the test bus. In the eight first selectors in the first test subcircuit, first input ends of first three first selectors may be connected to second output ends of the three data distribution circuits in the first test subcircuit. First input ends of last five first selectors may be connected to inputs of bits [3], [4], [5], [6], and [7] of the test bus. Second input ends of first five first selectors may be connected to inputs of bits [3], [4], [5], [6], and [7] of the test bus. Second input ends of last three first selectors may be connected to second output ends of the three data distribution circuits in the first test subcircuit. When the eight first selectors in the first test sub circuit are configured in a manner so that the first input end of the first selector is connected to an output end, a test bus allocated in the second test subcircuit is bits [0], [1], [2], [3], and [4] of the test bus. When the eight first selectors in the first test subcircuit are configured in a manner so that the second input end of the first selector is connected to the output end, a test bus allocated in the second test subcircuit is bits [3], [4], [5], [6], and [7] of the test bus. To be specific, the first selector is configured in the first test subcircuit in the foregoing solution, so that the test bus used in the second test subcircuit may be dynamically allocated. During the configuration, only the first selector needs to be configured to implement the dynamic allocation, and a configuration process is simple. Therefore, in the test circuit provided in the first aspect, the test bus used by the tested circuit is dynamically allocated by using the data distribution circuit and the first selector. This can greatly resolve a winding congestion problem, reduce test costs, simplify the configuration process, and improve test efficiency.

In a possible implementation of the first aspect, in the $j^{th}$ test subcircuit of the plurality of test subcircuits, based on a preset test bus sequence, the first input ends of the Nj data distribution circuits are sequentially connected to inputs of first Nj test buses. First input ends of first Nj first selectors are sequentially connected to the second output ends of the Nj data distribution circuits. First input ends of last M-Nj first selectors are sequentially connected to last M-Nj inputs of the test bus. In other words, in the $j^{th}$ test subcircuit, when the first selector is configured in a manner so that the first input end of the first selector is connected to the output end, test buses corresponding to the output and the input of the first selector are the same. This is referred to as a direct connection mode. Second input ends of first M-Nj first selectors are sequentially connected to the last M-Nj inputs of the test bus. Second input ends of last Nj first selectors are sequentially connected to the second output ends of the Nj data distribution circuits. In other words, in the $j^{th}$ test subcircuit, when the first selector is configured in a manner so that the second input end of the first selector is connected to the output end, the test buses corresponding to the output and the input of the first selector are different. This is referred to as a shift connection mode. In the foregoing possible implementation, the data distribution circuit is allocated to bus resources in the preset sequence according to a given rule, so that the test circuit can simplify a line design while ensuring dynamic allocation of test resources, thereby improving the test efficiency.

Further, the preset test bus sequence is a sequence or a reverse sequence of a bit sequence of the test bus. In the foregoing possible implementation, the preset test bus sequence is a specific sequence, for example, the sequence or reverse sequence of the test bus. In this manner, a line structure of the test circuit may be further simplified, to simplify a structure of the test circuit to some extent, and quickly meet a wiring requirement of the test circuit.

In another possible implementation of the first aspect, a quantity Nj of data distribution circuits in the $j^{th}$ test subcircuit is a quantity of scan channels of a corresponding tested circuit. The quantity of the scan channels of the corresponding tested circuit is a maximum value of a quantity $CI_j$ of scan input channels of the tested circuit and a quantity $CO_j$ of scan output channels of the tested circuit. In other words, Nj=max($CI_j$, $CO_j$). First output ends of $CI_j$ data distribution circuits in the Nj data distribution circuits are respectively connected to the $CI_j$ scan input channels of the tested circuit corresponding to the $j^{th}$ test subcircuit. In other words, a first output end of the data distribution circuit is configured to transmit the scan test data received from the test bus to a corresponding scan input channel of the tested circuit. Second input ends of $CO_j$ data distribution circuits in the Nj data distribution circuits are respectively connected to the $CO_j$ scan output channels of the tested circuit corresponding to the $j^{th}$ test subcircuit. In other words, a second input end of the data distribution circuit is configured to receive test result data output by a corresponding scan output channel of the tested circuit. The test result data is output to the test bus through a second output end of the data distribution circuit. According to this solution, a one-to-one correspondence between the scan input channel and the scan output channel of the tested circuit and the data distribution circuit is implemented, to facilitate transmission of test data. This avoids invalid output, further improves the test efficiency, and reduces test time.

In another possible implementation of the first aspect, each data distribution circuit may include a fourth selector, a register, and a fifth selector. The fourth selector is configured to enable the data distribution circuit to choose whether to receive data from the test bus or from the corresponding scan output channel of the tested circuit. To be specific, a first input end and a second input end of the fourth selector are respectively connected to a first input end and a second input end of the data distribution circuit. A control end of the fourth selector is connected to a first control end of the data distribution circuit. The register is configured to temporarily store the data received by the data distribution circuit. Therefore, an input end of the register is connected to an output end of the fourth selector. An output end of the register is connected to a first input end of the fifth selector. The fifth selector is configured to implement configuration of whether input data of the test bus passes through the register. In other words, a second input end of the fifth selector is connected to the first input end of the data distribution circuit. An output end of the fifth selector is connected to a second output end of the data distribution circuit. A control end of the fifth selector is connected to a second control end of the data distribution circuit. A first output end of the data distribution circuit is connected to the first input end of the data distribution circuit, the output end of the register, or the second output end of the data distribution circuit. In the foregoing possible implementation, the data distribution circuit has two inputs, which are respectively scan test data received from the test bus and test output data received from the corresponding scan output channel of the tested circuit. The data distribution circuit selects an input by configuring the fourth selector, so that the scan test data and the test output data are transmitted in different time periods. This avoids a data transmission conflict in a case of a simplified circuit structure. In addition, the data distribution circuit further controls, by configuring the fifth selector, whether a second output of the data distribution circuit passes through the register inside the data distribution circuit. Therefore, when the tested circuit corresponding to the test subcircuit in which the data distribution circuit is located does not participate in the test, a first input to the second output of the data distribution circuit do not pass through the register inside the data distribution circuit. This reduces the test time and further improves the test efficiency.

In a possible implementation of the first aspect, each test subcircuit may further include a controller. The controller may include a first signal interface. The first signal interface is connected to a control end of each first selector in the test subcircuit, and is configured to control the first input end in the first selector to connect to an output end or the second input end in the first selector to connect to the output end. Each test subcircuit may further include a second signal interface. The second signal interface is connected to a second control end of each data distribution circuit in the test subcircuit, and is configured to control the first input end and the second output end of the data distribution circuit to be directly connected or connected through the register. In the foregoing possible implementation, the test resources are dynamically allocated by configuring the first selector. When the tested circuit does not participate in the test, the data distribution circuit in the test subcircuit corresponding to the tested circuit that does not participate in the test is configured to be in a bypass state by configuring the fifth selector, even if the first input and the second output of the data distribution circuit do not pass through the internal register of the data distribution circuit. This reduces the test time. Therefore, in this optional solution, the first selector is configured by outputting a shift selection control signal through the first signal interface of the controller. The fifth selector in the data distribution circuit is configured by outputting a bypass enabling signal through the second signal interface of the controller.

In a possible implementation of the first aspect, in the $j^{th}$ test subcircuit of the plurality of test subcircuits, the data distribution circuit is connected to the scan input channel of the tested circuit corresponding to the $j^{th}$ test subcircuit through a first gate control circuit, and is configured to control whether data in the data distribution circuit is output to the scan input channel of the tested circuit corresponding to the $j^{th}$ test subcircuit. The data distribution circuit is connected to the scan output channel of the tested circuit corresponding to the $j^{th}$ test subcircuit through a second gating circuit, and is configured to control whether data of the scan output channel of the tested circuit corresponding to the $j^{th}$ test subcircuit is output to the data distribution circuit. In the foregoing possible implementation, a corresponding gating circuit is disposed between the scan input channel of the tested circuit and the data distribution circuit, and between the scan output channel of the tested circuit and the data distribution circuit. Therefore, data can be transmitted between the data distribution circuit and the scan input channel of the tested circuit or between the scan output channel of the tested circuit and the data distribution circuit only when the corresponding gating circuit is enabled. This avoids transmission of invalid data.

In a possible implementation of the first aspect, each test subcircuit may further include a state machine. The state machine may include a first state control interface, connected to a first control end of each data distribution circuit in the test subcircuit, and configured to generate an output capture enabling signal, and control each data distribution circuit in the test subcircuit whether to receive scan output data of the tested circuit. The state machine may include a second state control interface, connected to a control end of the first gate control circuit, and configured to generate a first gating enabling signal, and control whether data of each data distribution circuit in the test subcircuit is transmitted to a scan input channel of a corresponding tested circuit in the test subcircuit. The state machine may include a third state control interface, connected to a control end of the second gating circuit, and configured to generate a second gating enabling signal, and control whether data of a scan output channel of a corresponding tested circuit in the test subcircuit is transmitted to the data distribution circuit in the tested circuit. The state machine may include a fourth state control interface, connected to a scan enabling end of the scan structure of the tested circuit, configured to generate a scan enabling signal, and configured to control whether to perform test scanning on a scan structure of the tested circuit corresponding to the test subcircuit. In the foregoing possible implementation, the output capture enabling signal is generated through the first state control interface of the state machine, and is used to configure the fourth selector in the data distribution circuit to control whether the data distribution circuit receives the scan test data of the test bus or receives the scan output data of the tested circuit at the current time. The first gating enabling signal is generated through the second state interface of the state machine, to control whether the scan test data of the data distribution circuit is transmitted to the scan input channel of the tested circuit. The third gating enabling signal is generated through the third state interface of the state machine, to control whether the scanning data of the scan output channel of the tested circuit is transmitted to the data distribution circuit corresponding to the tested circuit. A scan enabling signal is generated through the fourth state interface, to control whether the scan structure of the tested circuit starts test scanning. The state machine generates the preceding four types of signals to configure a test process of the test circuit, thus simplifying the configuration process.

In a possible implementation of the first aspect, the test circuit is disposed inside or outside the tested circuit. In the foregoing possible implementation, regardless of whether the test circuit is disposed inside or outside the tested circuit, neither circuit running of the test circuit nor the tested circuit is affected.

According to a second aspect, a test circuit is provided. The test circuit includes a plurality of test subcircuits respectively corresponding to a plurality of tested circuits. The plurality of test subcircuits are configured to connect the corresponding tested circuits to a test bus. Each tested circuit corresponds to a test subcircuit. Each test subcircuit may transmit data required for test scanning to a scan input channel of a corresponding tested circuit through the test bus, and transmit test result data of a corresponding tested circuit to the test bus for output. Each test subcircuit may also dynamically allocate the test bus to the corresponding tested circuit. A $j^{th}$ test subcircuit in the plurality of test subcircuits includes M data distribution circuits, M second selectors, and $CI_j$ third selectors. The $j^{th}$ test subcircuit may be any one of the plurality of test subcircuits. Both a quantity of data distribution circuits in the $j^{th}$ test subcircuit and the quantity M of the second selectors are equal to a bit width of the test bus. The quantity $CI_j$ of the third selectors in the $j^{th}$ test subcircuit is equal to a quantity of scan input channels of a tested circuit corresponding to the $j^{th}$ test subcircuit. First input ends of the M data distribution circuits are respectively connected to M inputs of the test bus. In other words, the first input ends of the data distribution circuits are configured to receive scan test data of the test bus. Second output ends of the M data distribution circuits are respectively connected to M outputs of the test bus. In other words, the second output ends of the data distribution circuits are configured to output test result data to the test bus. In the $j^{th}$ test subcircuit, $CO_j$ input ends of each second selector in the M second selectors are respectively connected to $CO_j$ scan output channels of the tested circuit corresponding to the $j^{th}$ test subcircuit. Output ends of the M second selectors are respectively connected to second input ends of the M data distribution circuits in the test subcircuit. The second selector is a one-of-many multiplexer. A quantity of input ends of the second selector is related to a quantity of scan output channels of the tested circuit corresponding to the $j^{th}$ test subcircuit. For example, if the quantity of the scan output channels of the tested circuit is three, the second selector may select a one-of-three multiplexer, configured to select a data distribution circuit corresponding to each scan output channel of the tested circuit and a corresponding test bus. In the $j^{th}$ test subcircuit, M input ends of each third selector in the $CI_j$ third selectors are respectively connected to first output ends of the M data distribution circuits. Output ends of the $CI_j$ third selectors are respectively connected to $CI_j$ scan input channels of the tested circuit corresponding to the $j^{th}$ test subcircuit. The third selector is also a one-of-many multiplexer. A quantity of input ends of the third selector is related to a quantity of data distribution circuits corresponding to the $j^{th}$ test subcircuit. The quantity of the data distribution circuits is related to the bit width of the test bus. For example, if the bit width of the test bus is eight bits, the third selector may be a one-of-eight multiplexer, configured to select the data distribution circuit corresponding to the scan input channel of the tested circuit and the corresponding test bus.

Based on the test circuit provided in the second aspect, the test circuit transmits input data of a test vector, that is, the scan test data, to the data distribution circuit through the input of the test bus, and transmits the input data of the test vector to the scan input channel of the tested circuit through the data distribution circuit. After scanning of the tested circuit ends, output data of the test vector of the scan output channel of the tested circuit, that is, the test result data, is transmitted to the output of the test bus through the data distribution circuit to complete the test of the tested circuit. The second selector is used to configure the scan output channel of the tested circuit to select a connected data distribution circuit, and the third selector is used to configure the scan input channel of the tested circuit to select the connected data distribution circuit. Corresponding to each test subcircuit, a data distribution circuit is disposed on each bit of the test bus. Therefore, through configuration of the second selector and the third selector, not only bus resources can be resolved to resolve a problem of winding congestion, but also allocation of each scan channel of the tested circuit to any bus resource can be implemented, so that allocation of bus resources is more flexible.

In a possible implementation of the second aspect, each data distribution circuit may include a fourth selector, a register, and a fifth selector. For an internal structure of the data distribution circuit and a technical effect that can be generated, refer to the internal structure and the technical effect of the data distribution circuit of the test circuit provided in the first aspect. Details are not described herein again.

In a possible implementation of the second aspect, each test subcircuit may further include a controller. The controller may include a second signal interface, adapted to configure a fifth selector of a data distribution circuit in each test subcircuit, and configured to control a first input end and a second output end of the data distribution circuit to be directly connected or connected through a register. The controller may include a plurality of third signal interfaces, adapted to configure a plurality of second selectors in each test subcircuit, and configured to control a scan output channel of the tested circuit corresponding to the test subcircuit to be connected to a data distribution circuit in the test subcircuit. The controller may include a plurality of fourth signal interfaces, adapted to configure a plurality of third selectors in each test subcircuit, and configured to control the test subcircuit to select one of the data distribution circuits to connect to the scan input channel of the tested circuit corresponding to the test subcircuit. In the foregoing possible implementation, a bypass enabling signal is output through the second signal interface of the controller, to configure the fifth selector in the data distribution circuit. Therefore, when the tested circuit does not participate in the test, the data distribution circuit in the test subcircuit corresponding to the tested circuit that does not participate in the test is configured to be in a bypass state, even if a first input to a second output of the data distribution circuit do not pass through an internal register. This reduces a test time period. A scan output selection signal is outputting through the third signal interface of the controller. The second selector is configured by using the scan output selection signal. A corresponding data distribution circuit is selected to receive the scan output data of the tested circuit. Similarly, a scan input selection signal is output through the fourth signal interface of the controller. The third selector is configured by using the scan input selection signal. The corresponding data distribution circuit is selected to transmit the scan test data to the scan input channel of the tested circuit. In this implementation, a configuration process is simplified, thereby improving test efficiency.

In a possible implementation of the second aspect, in the $j^{th}$ test subcircuit of the plurality of test subcircuits, the third selector is connected to the scan input channel of the tested circuit corresponding to the $j^{th}$ test subcircuit through a first gate control circuit, and is configured to control whether data in the data distribution circuit is output to the scan input channel of the tested circuit corresponding to the $j^{th}$ test subcircuit. The scan output channel of the tested circuit corresponding to the $j^{th}$ test subcircuit is connected to the second selector through a second gating circuit, and is configured to control whether data of the scan output channel of the tested circuit corresponding to the $j^{th}$ test subcircuit is output to the data distribution circuit. In the foregoing possible implementation, a corresponding gating circuit is disposed between the scan input channel of the tested circuit and the data distribution circuit, and between the scan output channel of the tested circuit and the data distribution circuit. Therefore, data can be transmitted between the data distribution circuit and the scan input channel of the tested circuit or between the scan output channel of the tested circuit and the data distribution circuit only when the corresponding gating circuit is enabled. This avoids transmission of invalid data.

In a possible implementation of the second aspect, each test subcircuit may further include a state machine. For the state machine, refer to the state machine in the test circuit provided in the first aspect. Details are not described herein again.

According to a third aspect, another test circuit is provided. The test circuit includes a plurality of test subcircuits respectively corresponding to a plurality of tested circuits. The test subcircuits are configured to connect the tested circuits to a test bus. Each tested circuit corresponds to a test subcircuit. Each test subcircuit may transmit data required for test scanning to a scan input channel of a corresponding tested test circuit through the test bus, and transmit test result data of a corresponding tested circuit to the test bus for output. Each test subcircuit may also dynamically allocate the test bus to the corresponding tested circuit. A $j^{th}$ test subcircuit in the plurality of test subcircuits includes Nj groups of data distribution circuits and $CI_j$ OR gates. The $j^{th}$ test subcircuit may be any one of the plurality of test subcircuits. The quantity Nj of groups of data distribution circuits in the $j^{th}$ test subcircuit is a quantity of scan channels of the corresponding tested circuit, that is, a maximum value between a quantity $CI_j$ of scan input channels and a quantity $CO_j$ of scan output channels of the corresponding tested circuit. $Nj=Max(CI_j, CO_j)$. The $CI_j$ OR gates are respectively corresponding to $CI_j$ groups of data distribution circuits in the Nj groups of data distribution circuits. The $CI_j$ OR gates are respectively corresponding to the $CI_j$ scan input channels of the tested circuit. $CO_j$ groups of data distribution circuits in the Nj groups of data distribution circuits respectively correspond to the $CO_j$ scan output channels of the tested circuit. For example, the quantity of scan channels of the tested circuit is four, and the quantity of scan channels is a maximum value of the quantity of the scan input channels and the quantity of the scan output channels. Therefore, the quantity of groups of data distribution circuits in the test subcircuit corresponding to the tested circuit is four. Each group of data distribution circuits may correspond to one scan input channel and one scan output channel. The quantity of OR gates in the test subcircuit is the quantity of scan input channels, that is, three. Therefore, each OR gate also corresponds to a group of data distribution circuits and corresponds to a scan input channel of the tested circuit. In the $j^{th}$ test subcircuit, each group of data distribution circuits includes M data distribution circuits. The M data distribution circuits are respectively connected to a test bus of M bits. Each group of data distribution circuits in the Nj groups of data distribution circuits are serially connected to the corresponding test bus through a first input end and a second output end of each data distribution circuit in sequence. In other words, a plurality of data distribution circuits on the same test bus are connected to the same test bus through the first input end and the second output end in sequence. First output ends of the M data distribution circuits in each group of data distribution circuits are connected to M input ends of corresponding OR gates. Output ends of the OR gates are connected to corresponding scan input channels of the tested circuit. Second input ends of the M data distribution circuits in each group of data distribution circuits are connected to a corresponding scan output channel of the tested circuit. Each data distribution circuit is further configured to control reset of the data distribution circuit. When the data distribution circuit is reset, output of the data distribution circuit is zero. In each group of data distribution circuits, an output value of the OR gate is a value output by the first output end of the selected data distribution circuit, that is, an input value of the selected test bus.

Based on the test circuit provided in the third aspect, the test circuit transmits input data of a test vector, that is, the scan test data, to the data distribution circuit through the input of the test bus, and transmits the input data of the test vector to the scan input channel of the tested circuit through the data distribution circuit. After scanning of the tested circuit ends, output data of the test vector of the scan output channel of the tested circuit, that is, the test result data, is transmitted to the output of the test bus through the data distribution circuit to complete the test of the tested circuit. An OR gate is disposed between the scan input channel of the tested circuit and the data distribution circuit connected to the test bus. The data transmitted to the scan input channel of the tested circuit is selected through the OR gate. In this way, area overheads can be reduced as much as possible, and a winding congestion problem can be resolved, thereby reducing test costs. In addition, by performing a reset operation on unselected data distribution circuits, the output value of each OR gate may be the value output by the first output end of the selected data distribution circuits, thereby implementing correct test bus resource allocation, further simplifying a configuration process, and improving test efficiency.

In a possible implementation of the third aspect, each data distribution circuit may include a fourth selector, a register, and a fifth selector. For an internal structure of the data distribution circuit, refer to the internal structure of the data distribution circuit in the test circuit provided in the first aspect. Details are not described herein again. A difference lies in that a second control end of the data distribution circuit is further connected to a reset end of the register, and is configured to control reset of the register. In the foregoing possible implementation, because the data distribution circuit needs to be reset, when the data distribution circuit needs to perform bypass selection by using the fifth selector, the register in the data distribution circuit may be controlled, by using a bypass enabling signal, to be reset. A structure is simpler.

In a possible implementation of the third aspect, each test subcircuit may further include a controller. The controller may include a second signal interface. The second signal interface is connected to a second control end of each data distribution circuit in the test subcircuit, and is configured to control the first input end and the second output end of the data distribution circuit to be directly connected or connected through the register, and control reset of the register. In the foregoing possible implementation, a bypass enabling signal is output through the second signal interface of the controller, to configure the fifth selector in the data distribution circuit, set a data distribution circuit that is not selected in the test subcircuit to bypass, and control the register of the data distribution circuit to reset, to meet a requirement of a scan input channel of the tested circuit for selecting the data distribution circuit. A configuration process is simple, and test efficiency is further improved.

In a possible implementation of the third aspect, in the $j^{th}$ test subcircuit of the plurality of test subcircuits, the OR gate is connected to the scan input channel of the tested circuit corresponding to the $j^{th}$ test subcircuit through a first gate control circuit, and is configured to control whether data in the data distribution circuit is output to the scan input channel of the tested circuit corresponding to the $j^{th}$ test subcircuit. The scan output channel of the tested circuit corresponding to the $j^{th}$ test subcircuit is connected to the data distribution circuit through a second gating circuit, and is configured to control whether data of the scan output channel of the tested circuit corresponding to the $j^{th}$ test subcircuit is output to the data distribution circuit. In the foregoing possible implementation, a corresponding gating circuit is disposed between the scan input channel of the tested circuit and the data distribution circuit, and between the scan output channel of the tested circuit and the data distribution circuit. Therefore, data can be transmitted between the data distribution circuit and the scan input channel of the tested circuit or between the scan output channel of the tested circuit and the data distribution circuit only when the corresponding gating circuit is enabled. This avoids transmission of invalid data.

In a possible implementation of the third aspect, each test subcircuit may further include a state machine. For the state machine, refer to the state machine in the test circuit provided in the first aspect. Details are not described herein again.

According to a fourth aspect, another test circuit is provided. The test circuit includes a plurality of test subcircuits respectively corresponding to a plurality of tested circuits. The plurality of test subcircuits are configured to respectively connect the corresponding tested circuits to a test bus. Each tested circuit corresponds to a test subcircuit. Each test subcircuit may transmit data required for test scanning to a scan input channel of a corresponding tested circuit through the test bus, and transmit test result data of a corresponding tested circuit to the test bus for output. Each test subcircuit may also dynamically allocate the test bus to the corresponding tested circuit. A $j^{th}$ test subcircuit in the plurality of test subcircuits includes Nj data distribution circuits and M first selectors. The $j^{th}$ test subcircuit may be any one of the plurality of test subcircuits. The quantity Nj of data distribution circuits in the $j^{th}$ test subcircuit is a quantity of scan channels of the corresponding tested circuit, that is, a maximum value between a quantity $CI_j$ of scan input channels and a quantity $CO_j$ of scan output channels of the corresponding tested circuit. $Nj=\max(CI_j, CO_j)$. The data distribution circuit is configured to receive scan test data of the test bus and transmit the scan test data to the scan input channel of the tested circuit, and receive test result data of a scan output channel of the tested circuit and transmit the test result data to the test bus for output. The first selector may be an alternative selector, and is configured to select a test bus used by a $(j+1)^{th}$ test subcircuit. In the $j^{th}$ test subcircuit, first input ends of Nj data distribution circuits are respectively connected to Nj inputs of the test bus. In other words, the first input ends of the data distribution circuits are configured to receive scan test data of the test bus. First output ends of $CI_j$ data distribution circuits in the Nj data distribution circuits are respectively connected to $CI_j$ scan input channels of the tested circuit corresponding to the $j^{th}$ test subcircuit. In other words, a first input end of the data distribution circuit is configured to transmit the scan test data received from the test bus to a corresponding scan input channel of the tested circuit. Second input ends of $CO_j$ data distribution circuits in the Nj data distribution circuits are respectively connected to $CO_j$ scan output channels of the tested circuit corresponding to the $j^{th}$ test subcircuit. In other words, a second input end of the data distribution circuit is configured to receive test result data output by the corresponding scan output channel of the tested circuit. The test result data is output to the test bus through a second output end of the data distribution circuit. A quantity M of first selectors of each test subcircuit in the plurality of test subcircuits is equal to a bit width of the test bus. Output ends of the M first selectors in each test subcircuit are respectively connected to the M outputs of the test bus. The M first selectors in each test subcircuit respectively correspond to M bits of the test bus. First input ends of the M first selectors are respectively connected to M inputs of the test bus. Second input ends of Nj first selectors of the M first selectors are respectively connected to the second output ends of the Nj data distribution circuits. Second input ends of the remaining M-Nj first selectors are respectively connected to the inputs of the M-Nj test buses on which no data distribution circuit is disposed. The first input end and the second output end of each first selector are connected to different buses. In the $j^{th}$ test subcircuit, the test buses connected to the first input end and the second input end of the first selector are different. The test bus used by the $(j+1)^{th}$ test subcircuit may be selected through the first selector.

Based on the test circuit provided in the fourth aspect, the test circuit transmits input data of a test vector to the data distribution circuit through the input of the test bus, and transmits the input data of the test vector to the scan input channel of the tested circuit through the data distribution circuit. After scanning of the tested circuit ends, output data of the test vector of the scan output channel of the tested circuit is transmitted to the output of the test bus through the data distribution circuit to complete the test of the tested circuit. A dynamic correspondence between the data distribution circuit and the test bus is implemented by configuring the first selector, so that test resources can be dynamically allocated. For example, if the M first selectors in the $j^{th}$ test subcircuit are configured to select the first input end of the first selector to connect to the output end, a test bus allocated to the $(j+1)^{th}$ test subcircuit is a test bus A. Similarly, if the M first selectors in the $j^{th}$ test subcircuit are configured to select the second input end of the first selector to connect to the output end, a test bus allocated to the $(j+1)^{th}$ test subcircuit is a test bus B. The data distribution circuit in the $(j+1)^{th}$ test subcircuit corresponds to a group of first selectors in the $j^{th}$ test subcircuit, and is marked as a first selector X. Therefore, the test bus A is a test bus connected to the first selector X when the first selector X is configured to select that the first input end of the first selector is connected to the output end of the first selector. The test bus B is a test bus connected to the first selector X when the first selector X is configured to select that the second input end of the first selector is connected to the output end. The test circuit provided in the fourth aspect can greatly resolve a winding congestion problem, to reduce test costs, simplify a configuration process, and improve test efficiency. In addition, in the $j^{th}$ test subcircuit, the first input end of the first selector is directly connected to the input of the test bus, so that when the tested circuit corresponding to the $j^{th}$ test subcircuit does not participate in the test, input data of the $(j+1)^{th}$ test subcircuit does not pass through the data distribution circuit in the $j^{th}$ test subcircuit. This reduces test time.

In a possible implementation of the fourth aspect, in the $j^{th}$ test subcircuit of the plurality of test subcircuits, based on a preset bus sequence, first input ends of the Nj data distribution circuits are sequentially connected to inputs of first Nj buses. First input ends of the M first selectors are sequentially connected to M inputs of the test bus. Second input ends of first M-Nj first selectors are sequentially connected to last M-Nj inputs of the test bus. Second input ends of last Nj first selectors are sequentially connected to the second output ends of the Nj data distribution circuits. In the foregoing possible implementation, the data distribution circuit is allocated to bus resources in the preset sequence according to a given rule, so that the test circuit can simplify line design and facilitate wiring while ensuring dynamic allocation of test resources.

In a possible implementation of the fourth aspect, the preset bus sequence is a sequence or a reverse sequence of a bit sequence of the buses. In the foregoing possible implementation, the preset test bus sequence is a specific sequence, for example, the sequence or reverse sequence of the test bus. In this manner, a line structure of the test circuit may be further simple and effective, to simplify a structure of the test circuit to some extent, and quickly meet a wiring requirement of the test circuit.

In a possible implementation of the fourth aspect, each data distribution circuit may include a fourth selector and a register. A first input end and a second input end of the fourth selector are respectively connected to a first input end and a second input end of the data distribution circuit. A control end of the fourth selector is connected to a first control end of the data distribution circuit. An input end of the register is connected to an output end of the fourth selector. An output end of the register is connected to a second output end of the data distribution circuit. A first output end of the data distribution circuit is connected to the first input end of the data distribution circuit or an output end of the register. In the foregoing possible implementation, the data distribution circuit has two inputs, which are respectively scan test data received from the test bus and test output data received from the corresponding scan output channel of the tested circuit. The data distribution circuit selects an input by configuring the fourth selector, so that the scan test data and the test output data are transmitted in different time periods. This avoids a data transmission conflict in a case of a simplified circuit structure.

In a possible implementation of the fourth aspect, each test subcircuit may further include a controller. The controller may include a first signal interface. The first signal interface is connected to control ends of M first selector in the test subcircuit, and is configured to control the first input end in the first selector to connect to an output end or the second input end in the first selector to connect to the output end. In the foregoing possible implementation, a shift selection control signal is output through the first signal interface of the controller, to configure the first selector. Configuration is simple and easy. When the first selector is configured to connect the first input end and the output end of the first selector, all test bus resources in the test subcircuit corresponding to the first selector do not pass through the data distribution circuit. Therefore, when the tested circuit corresponding to the test subcircuit does not participate in the test, the first selector is configured to connect the first input end and the output end of the first selector. This can reduce test time.

In a possible implementation of the fourth aspect, in the $j^{th}$ test subcircuit of the plurality of test subcircuits, the data distribution circuit is connected to the scan input channel of the tested circuit corresponding to the $j^{th}$ test subcircuit through a first gate control circuit, and is configured to control whether data in the data distribution circuit is output to the scan input channel of the tested circuit corresponding to the $j^{th}$ test subcircuit. The data distribution circuit is connected to the scan output channel of the tested circuit corresponding to the $j^{th}$ test subcircuit through a second gating circuit, and is configured to control whether data of the scan output channel of the tested circuit corresponding to the $j^{th}$ test subcircuit is output to the data distribution circuit. In the foregoing possible implementation, a corresponding gating circuit is disposed between the scan input channel of the tested circuit and the data distribution circuit, and between the scan output channel of the tested circuit and the data distribution circuit. Therefore, data can be transmitted between the data distribution circuit and the scan input channel of the tested circuit or between the scan output channel of the tested circuit and the data distribution circuit only when the corresponding gating circuit is enabled. This avoids transmission of invalid data.

In a possible implementation of the fourth aspect, each test subcircuit may further include a state machine. For the state machine, refer to the state machine in the test circuit provided in the first aspect. Details are not described herein again.

Optionally, each test subcircuit in the first aspect to the fourth aspect may further include a frequency dividing circuit. The frequency dividing circuit is connected to a bus clock interface and a scanning clock interface of the tested circuit respectively, and is configured to classify a clock of the test bus as a scanning clock of the tested circuit. In the foregoing optional solution, a high-speed scan clock of the test bus is divided into a low-speed scan clock in the tested circuit, to facilitate a scan test on the tested circuit.

According to a fifth aspect, an integrated circuit is provided. The integrated circuit includes: a plurality of tested circuits, a test bus, and any possible test circuit according to the first aspect to the fourth aspect. The plurality of tested circuits are connected to the test bus through a plurality of test subcircuits corresponding to the tested circuits in the test circuit.

According to a sixth aspect, an electronic device is provided. The electronic device includes a printed circuit board and the integrated circuit provided in the fifth aspect. The integrated circuit is disposed on the printed circuit board.

According to a seventh aspect, a test circuit design method is provided. The design method of the test circuit includes: obtaining a quantity of scan input channels, a quantity of scan output channels, and a bus bit width of a test bus of each tested circuit. The method includes: configuring, on the test bus, a data distribution circuit in a test subcircuit corresponding to each tested circuit based on the bit width of the test bus, the quantity of the scan input channels, and the quantity of the scan output channels of each tested circuit, to generate any possible test circuit in the first aspect to the fourth aspect. A quantity of data distribution circuits in the test subcircuit corresponding to each tested circuit is determined by the bit width of the test bus, or the quantity of the scan input channels and the quantity of the scan output channels of each tested circuit.

According to an eighth aspect, a circuit test method is provided. The circuit test method may be used in EDA software, and is applicable to testing a tested circuit through a test circuit. The test circuit is any possible test circuit in the first aspect to the fourth aspect. The circuit test method includes: generating configuration information and a test vector. The configuration information is used to configure the test circuit. The test vector is test excitation data of the tested circuit and is determined by a circuit structure of the tested circuit.

In a possible implementation of the eighth aspect, the circuit test method may further include: configuring a test circuit based on the configuration information. The method further includes transmitting the test vector to a test bus, and transmitting the test vector to a scan input channel of the tested circuit through the test circuit. The method further includes transmitting test result data of the tested circuit to an output of the test bus through the tested circuit.

It should be understood that, when the test circuit is configured, a specific configuration method and configuration content vary based on different test circuit structures.

For example, in the test circuit according to the first aspect, the shift selection control signal may be configured by using the first signal interface of the controller, to control a connection relationship between an input and an output selected by the first selector. When the tested circuit does not participate in the test, the first selector in the test subcircuit corresponding to the tested circuit is set to a direct connection mode. In other words, the first selector is configured to connect the first input end to the output end. The bypass enabling signal may be configured by using the second signal interface of the controller, so that the data distribution circuit in the test subcircuit corresponding to the tested circuit that does not participate in the test is set to a bypass state. In other words, no register is used between the first input end and the second output end in the corresponding data distribution circuit.

In the test circuit according to the second aspect, the scan output selection signal and the scan input selection signal may be configured by using the controller. The scan output selection signal is output through the third signal interface, and is used to configure the second selector, so that the scan output channel of the tested circuit corresponding to the test subcircuit is connected to a data distribution circuit in the test subcircuit. The scan input selection signal is output through the fourth signal interface, and is used to configure the third selector, so that the test subcircuit selects one of the data distribution circuits to connect to the scan input channel of the tested circuit corresponding to the test subcircuit.

In the test circuit according to the third aspect, the bypass enabling signal may be configured by using the second signal interface of the controller. The bypass enabling signal may be used as a reset signal of the data distribution circuit. When the data distribution circuit is reset, it indicates that the data distribution circuit is not selected. Therefore, a value output by the first output end of the selected data distribution circuit is an input value of the selected test bus. This implements a one-to-one correspondence between the test bus, the data distribution circuit, and a scan channel of the tested circuit.

In the test circuit according to the fourth aspect, the shift selection control signal may be configured by using the first signal interface of the controller, to control a connection relationship between an input and an output selected by the first selector. When the tested circuit does not participate in the test, the first selector in the test subcircuit corresponding to the tested circuit is set to a direct connection mode. In other words, the first selector is configured to connect the first input end to the output end.

In addition, in the test circuit according to the first aspect to the fourth aspect, the output capture enabling signal is configured through the first state control interface of the state machine. The second state control interface of the state machine is configured to output the first gating enabling signal. The third state control interface of the state machine is configured to output the second gating enabling signal. The fourth state control interface of the state machine is configured to output the scan enabling signal. For functions of the output capture enabling signal, the first gating enabling signal, the second gating enabling signal, and the scan enabling signal, refer to descriptions about the state machine in the first aspect. Details are not described herein again.

In a possible implementation of the eighth aspect, the transmitting a test vector to the scan input channel of the tested circuit through the test circuit includes: transmitting the test vector to the scan input channel of the tested circuit based on a correspondence between the scan input channel of the tested circuit and an input of the test bus through the input of the test bus corresponding to the scan input channel of the tested circuit. The correspondence between the scan input channel of the tested circuit and the input of the test bus is determined by a data distribution circuit in a test subcircuit corresponding to the tested circuit. For example, in the test circuits according to the first aspect and the fourth aspect, the scan input channel of the tested circuit and the data distribution circuit in the corresponding test subcircuit are in a one-to-one correspondence. Therefore, the correspondence between the scan input channel of the tested circuit and the input of the test bus is actually an actual connection between the data distribution circuit in the test subcircuit corresponding to the tested circuit and the test bus. In the test circuit according to the second aspect, the scan input channel of the tested circuit and the data distribution circuit in the test subcircuit corresponding to the tested circuit are in a one-to-many relationship. Therefore, the correspondence between the scan input channel of the tested circuit and the input of the test bus may be configured by the scan input selection signal configured by the controller. After configuration, the test bus connected to the data distribution circuit selected by the scan input channel of the tested circuit corresponds to the scan input channel of the tested circuit. In the test circuit according to the third aspect, the scan input channel of the tested circuit and the data distribution circuit in the test subcircuit corresponding to the tested circuit are in a one-to-many relationship. Therefore, the correspondence between the scan input channel of the tested circuit and the input of the test bus may be controlled by the bypass enabling signal. The bypass enabling signal may control the data distribution circuit to reset. When the data distribution circuit is not reset, the data distribution circuit is selected by the scan input channel of the corresponding tested circuit. In other words, the correspondence between the scan input channel of the tested circuit and the input of the test bus is determined by the data distribution circuit that is not reset.

In a possible implementation of the eighth aspect, the transmitting test result data of the tested circuit to an output of the test bus through the tested circuit includes: transmitting the test result data output by a scan output channel of the tested circuit to the output of the test bus corresponding to the scan output channel of the tested circuit based on a correspondence between the scan output channel of the tested circuit and the output of the test bus. The correspondence between the scan output channel of the tested circuit and the output of the test bus is determined by a data distribution circuit in a test subcircuit corresponding to the tested circuit. The method for determining the correspondence between the scan output channel of the tested circuit and the output of the test bus is similar to the method for determining the correspondence between the scan input channel of the tested circuit and the input of the test bus, and is not described herein again.

Further, the transmitting the test vector to the scan input channel of the tested circuit based on a correspondence between the scan input channel of the tested circuit and an input of the test bus through the input of the test bus corresponding to the scan input channel of the tested circuit includes: The test bus transmits the test vector to the scan input channel of the tested circuit in sequence in a plurality of bus clock cycles. A quantity of scan input channels of the tested circuit corresponding to one input of the test bus exceeds one.

It should be noted that, when the tested circuit is tested, a plurality of tested circuits may be tested at the same time. However, the bit width of the test bus is limited. Therefore, the test bus is multiplexed. In other words, the test bus transmits data to scan input channels of the plurality of tested circuits through time sequence dividing. In one bus clock cycle, the test bus can transmit the data to only one scan input channel. Therefore, if one input of the test bus needs to transmit data to a plurality of scan input channels, the data is divided and transmitted in sequence in a plurality of bus clock cycles.

Further, the transmitting the test result data output by a scan output channel of the tested circuit to the output of the test bus corresponding to the scan output channel of the tested circuit based on a correspondence between the scan output channel of the tested circuit and the output of the test bus includes: The test bus transmits the test result data in the scan output channel of the tested circuit to the output of the test bus in sequence in a plurality of clock cycles. A quantity of scan output channels of the tested circuit corresponding to one output of the test bus exceeds one. The test result data is transmitted to the test bus. Similarly, the scan test data, that is, the test vector, is transmitted to the scan input channel of the tested circuit. Details are not described herein again.

According to a ninth aspect, a computer-readable storage medium is provided. The computer-readable storage medium includes a program or instructions. When the program or the instructions is/are run on a computer, the computer is enabled to perform any possible circuit test method in the eighth aspect.

According to a tenth aspect, a computer program product is provided. The computer program product includes computer program code. When the computer program code is run on a computer, the computer is enabled to perform any possible circuit test method in the eighth aspect.

It may be understood that any integrated circuit, electronic device, test circuit design method, circuit test method, computer-readable storage medium, computer program product, and the like provided above may be implemented by the corresponding test circuit provided above or associated with the corresponding test circuit provided above. Therefore, for beneficial effects that can be achieved by the test circuit, refer to beneficial effects in the test circuit provided above. Details are not described herein again.

BRIEF DESCRIPTION OF DRAWINGS

FIG. 2A and FIG. 2B are a schematic diagram 1 of a structure of a tested circuit, a test bus, and a test circuit shown in FIG. 1;

FIG. 13A and FIG. 13B are a schematic diagram of a structure of another test solution corresponding to FIG. 2A and FIG. 2B;

Figure 1:
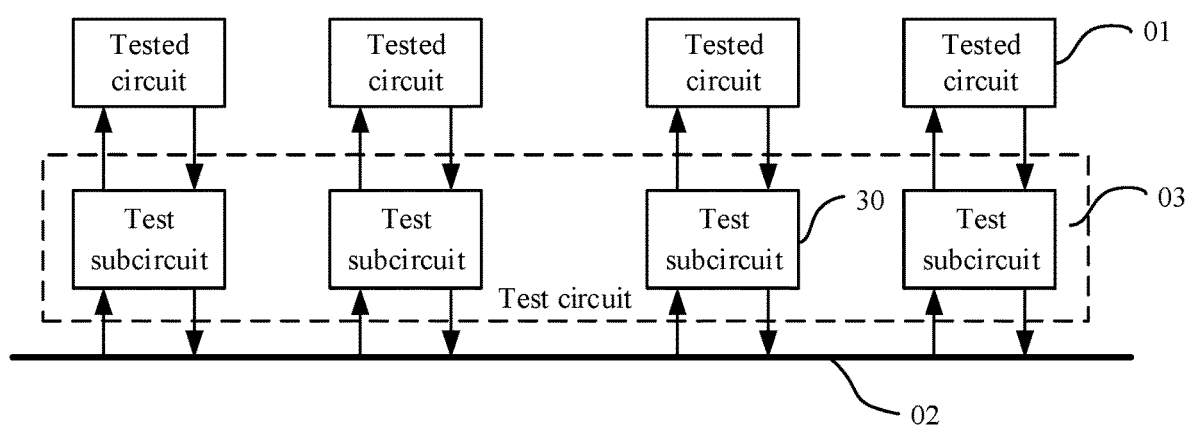
FIG. 1 is a schematic diagram of a structure of an integrated circuit according to an embodiment of this application.

REFERENCE NUMERALS 01-tested circuit; 02-test bus; 03-test circuit; 30-test sub-circuit; 301-data distribution circuit; 302-first selector; 303-controller; 304-state machine; 305-frequency dividing circuit; 306-first gate control circuit; 307-second gating circuit; 308-second selector; 309-third selector; 310-OR gate; 3011-fourth selector; 3012-register; 3013-fifth selector.

DESCRIPTION OF EMBODIMENTS

The following describes the technical solutions in embodiments of this application with reference to the accompanying drawings in embodiments of this application. It is clear that the described embodiments are merely a part rather than all of embodiments of this application.

Terms such as "first" and "second" mentioned below are merely intended for a purpose of description, and shall not be understood as an indication or implication of relative importance or implicit indication of a quantity of indicated technical features. Therefore, a feature limited by "first", "second", or the like may explicitly or implicitly include one or more features.

It should be noted that, in this application, words such as "example" or "for example" are used for representing giving an example, an illustration, or a description. Any embodiment or design scheme described as an "example" or "for example" in this application should not be explained as being more preferred or having more advantages than another embodiment or design scheme. Exactly, use of the word such as "example" or "for example" is intended to present a related concept in a specific manner.

In this application, unless otherwise specified and limited, the term "connection" should be understood in a broad sense. For example, "connection" may refer to a direct physical connection, or may refer to an electrical connection implemented by using an intermediate medium, for example, a connection implemented by using a resistor, an inductor, a capacitor, or another electronic component.

Embodiments of this application provide a test circuit 03 (as shown in FIG. 1). The test circuit 03 is configured to test a plurality of functional modules of the integrated circuit, so that the integrated circuit can complete a given function. Different integrated circuits may implement different functions, and therefore function modules of the integrated circuits are also different. For example, a mobile phone chip includes a processor module, a touchscreen control module, a storage module, a power management module, and the like.

Embodiments of this application provide an integrated circuit. FIG. 1 is a schematic diagram of a structure of an integrated circuit according to an embodiment of this application. Refer to FIG. 1. The integrated circuit includes a plurality of tested circuits 01, a test bus 02, and a test circuit 03. Different tested circuits in each integrated circuit may implement a same function, or may implement completely different functions. The test circuit 03 includes a plurality of test subcircuits 30 corresponding to the plurality of tested circuits 01. In other words, each tested circuit 01 corresponds to one test subcircuit 30. The plurality of tested circuits 01 are connected to the test bus 02 through the plurality of test subcircuits 30, so that the integrated circuit can perform a function test on the plurality of tested circuits 01 based on a planned test rule.

An embodiment of this application further provides an electronic device. The electronic device includes a printed circuit board and the integrated circuit provided in the foregoing embodiment. The integrated circuit provided in the foregoing embodiment is disposed on the printed circuit board. The electronic device includes an electronic device such as a mobile phone, a tablet computer (pad), a computer, an intelligent wearable product (for example, a smartwatch or a smart band), a virtual reality (VR) terminal device, and an augmented reality (AR) terminal device. A specific form of the electronic device is not specially limited in embodiments of this application.

The following describes in detail the test circuit 03 provided in embodiments of this application with reference to the accompanying drawings.

Figure 2B:
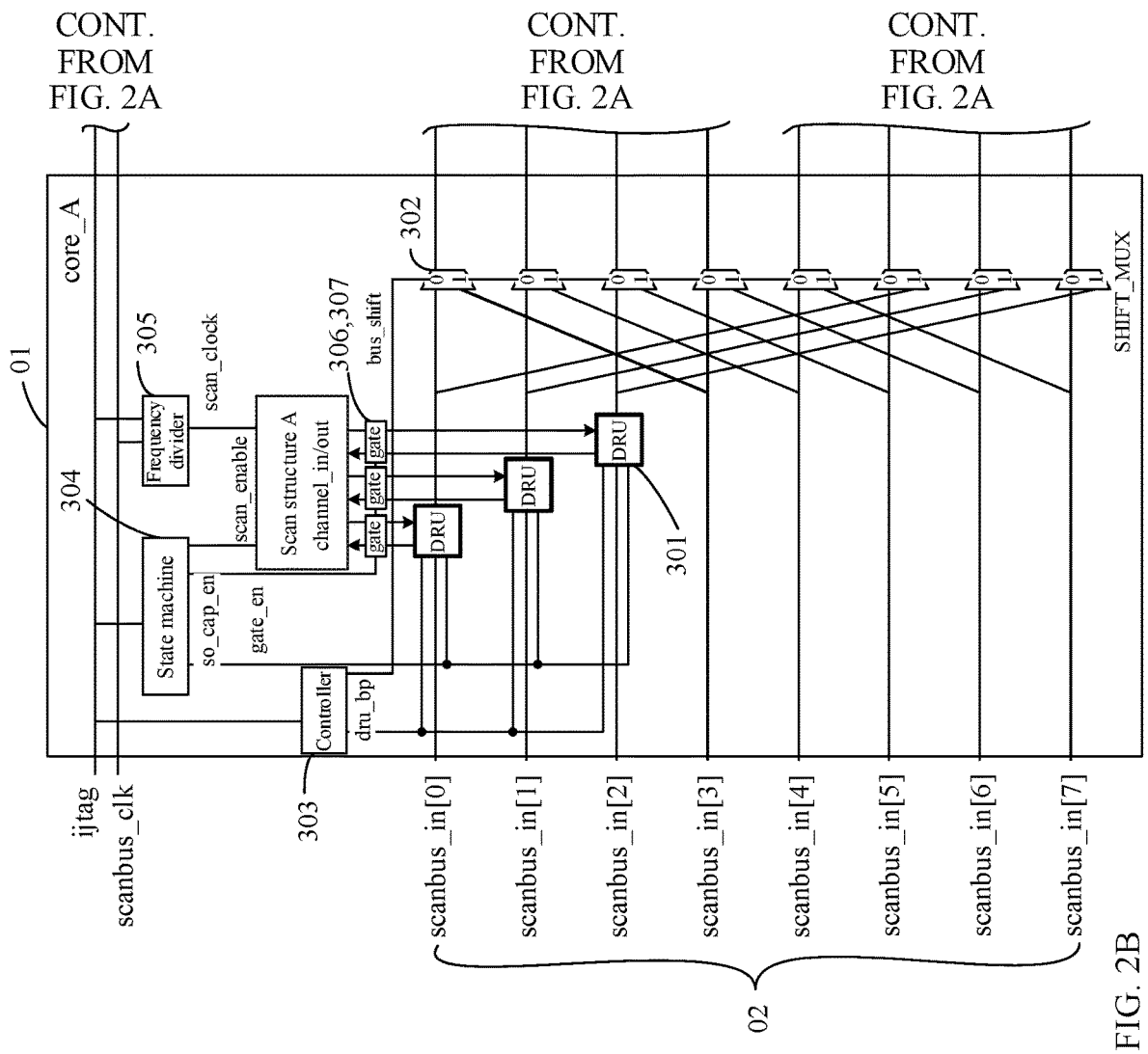
Figure 5A:
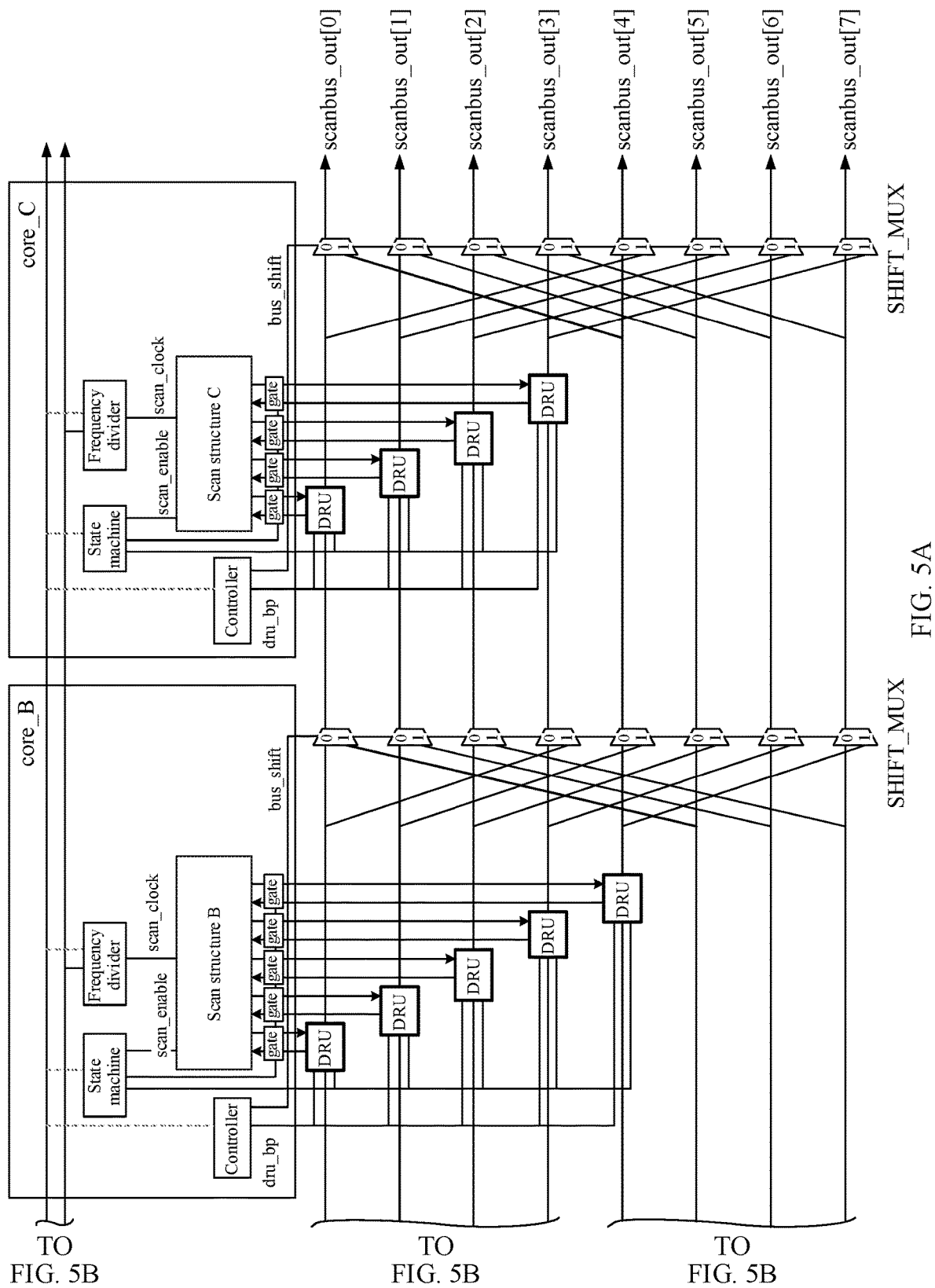
FIG. 5A and FIG. 5B are a schematic diagram 2 of a structure of a tested circuit, a test bus, and a test circuit shown in FIG. 1.
Figure 5B:
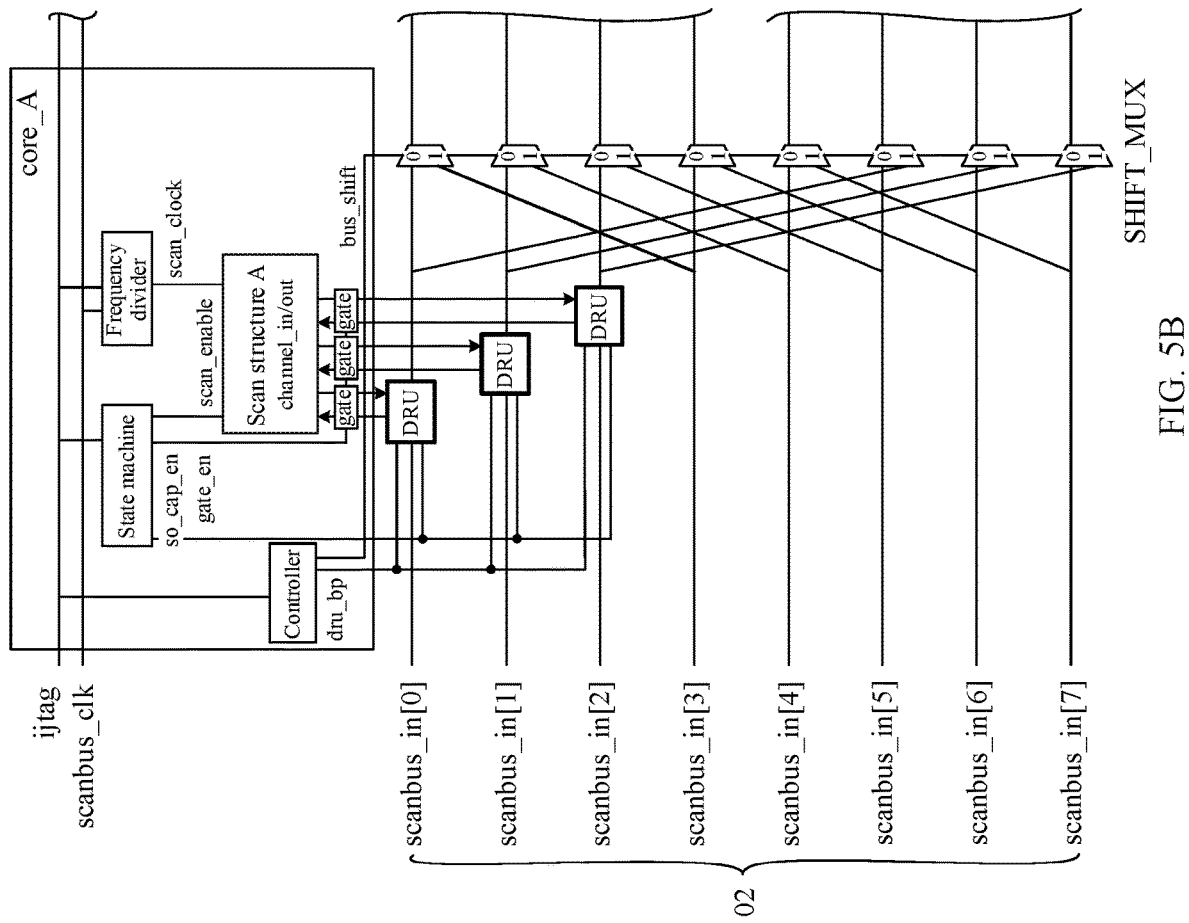
Figure 6A:
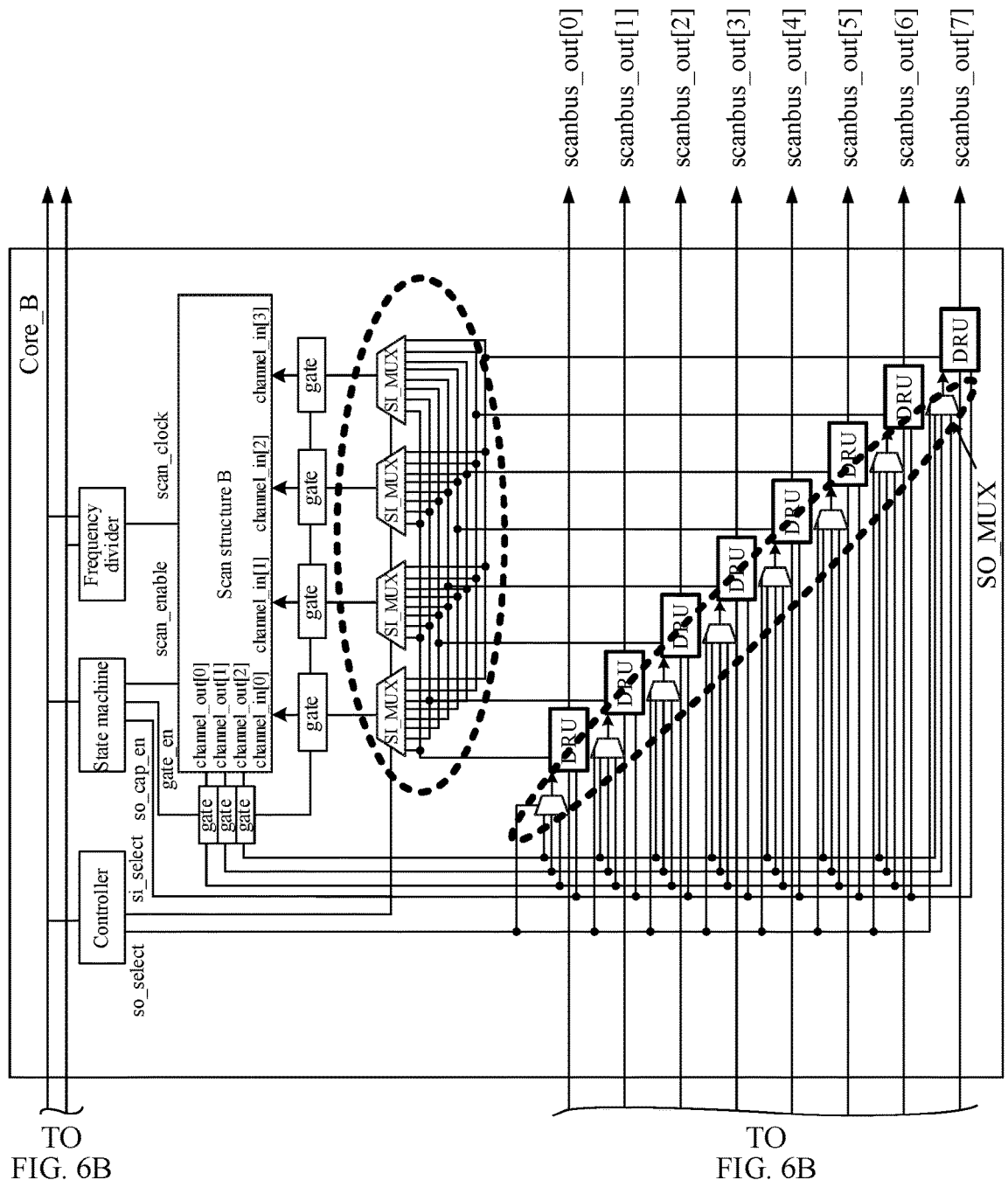
FIG. 6A and FIG. 6B are a schematic diagram 3 of a structure of a tested circuit, a test bus, and a test circuit shown in FIG. 1.
Figure 6B:
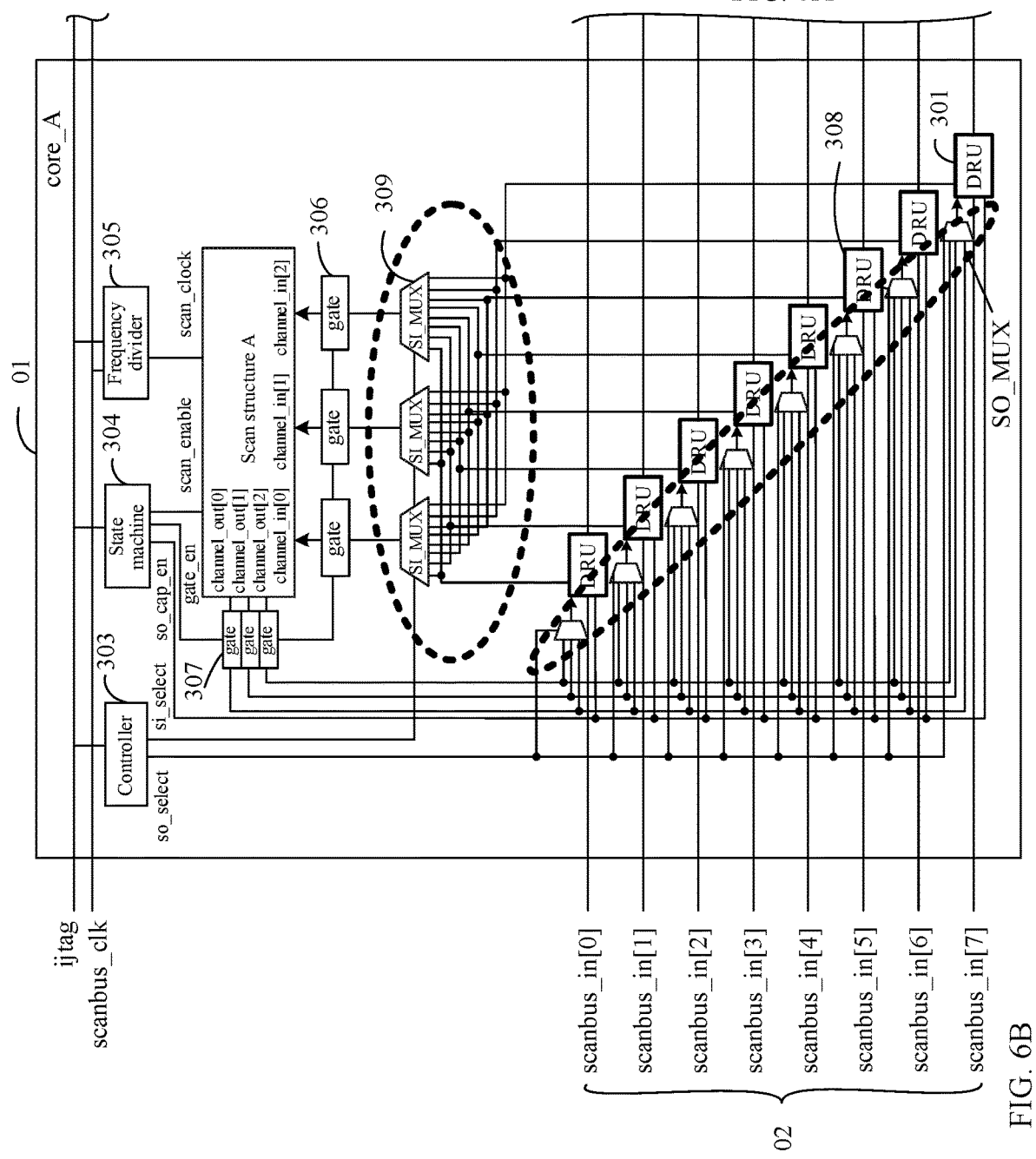
Figure 7A:
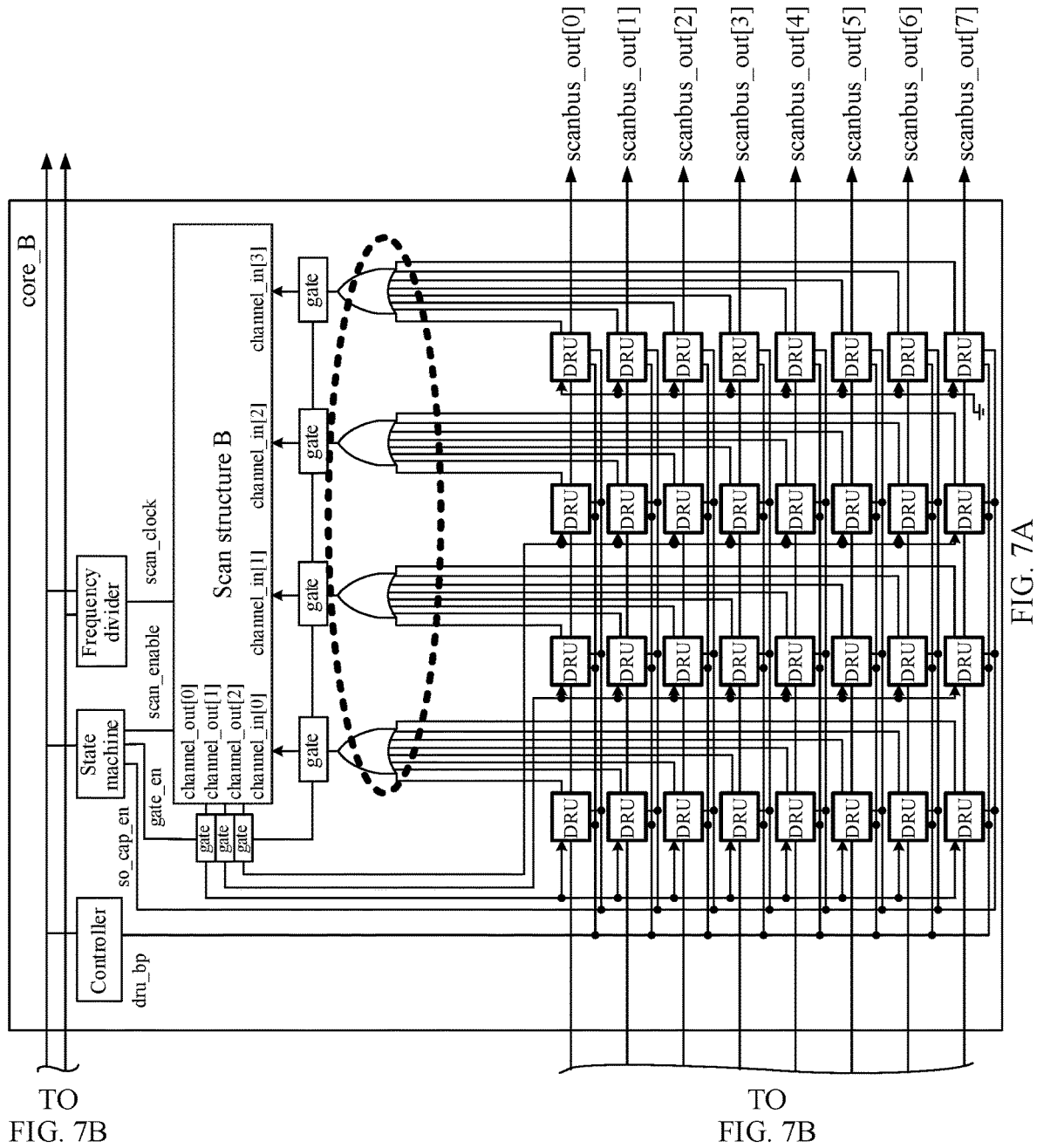
FIG. 7A and FIG. 7B are a schematic diagram 4 of a structure of a tested circuit, a test bus, and a test circuit shown in FIG. 1.
Figure 7B:
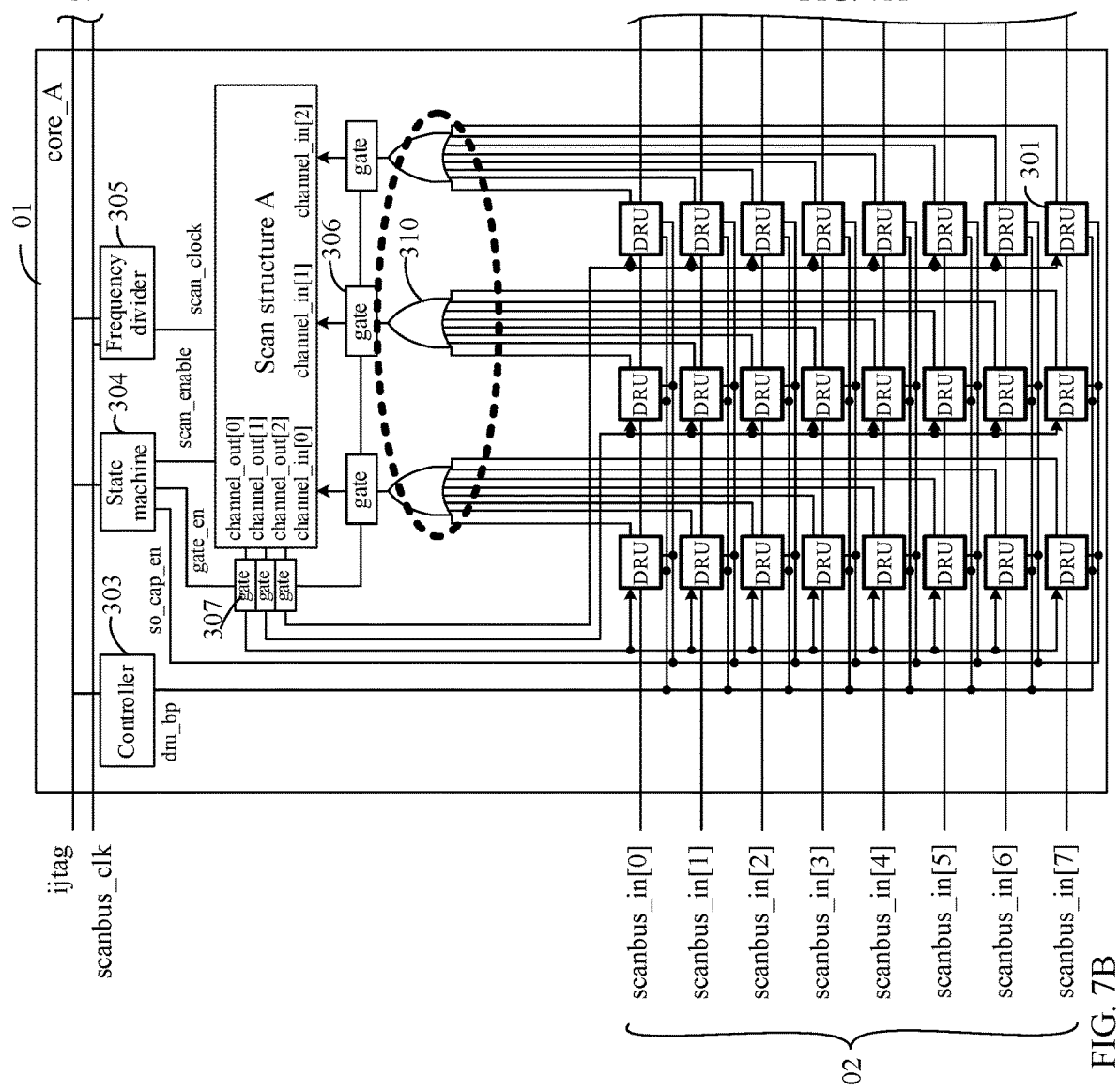
Figure 9A:
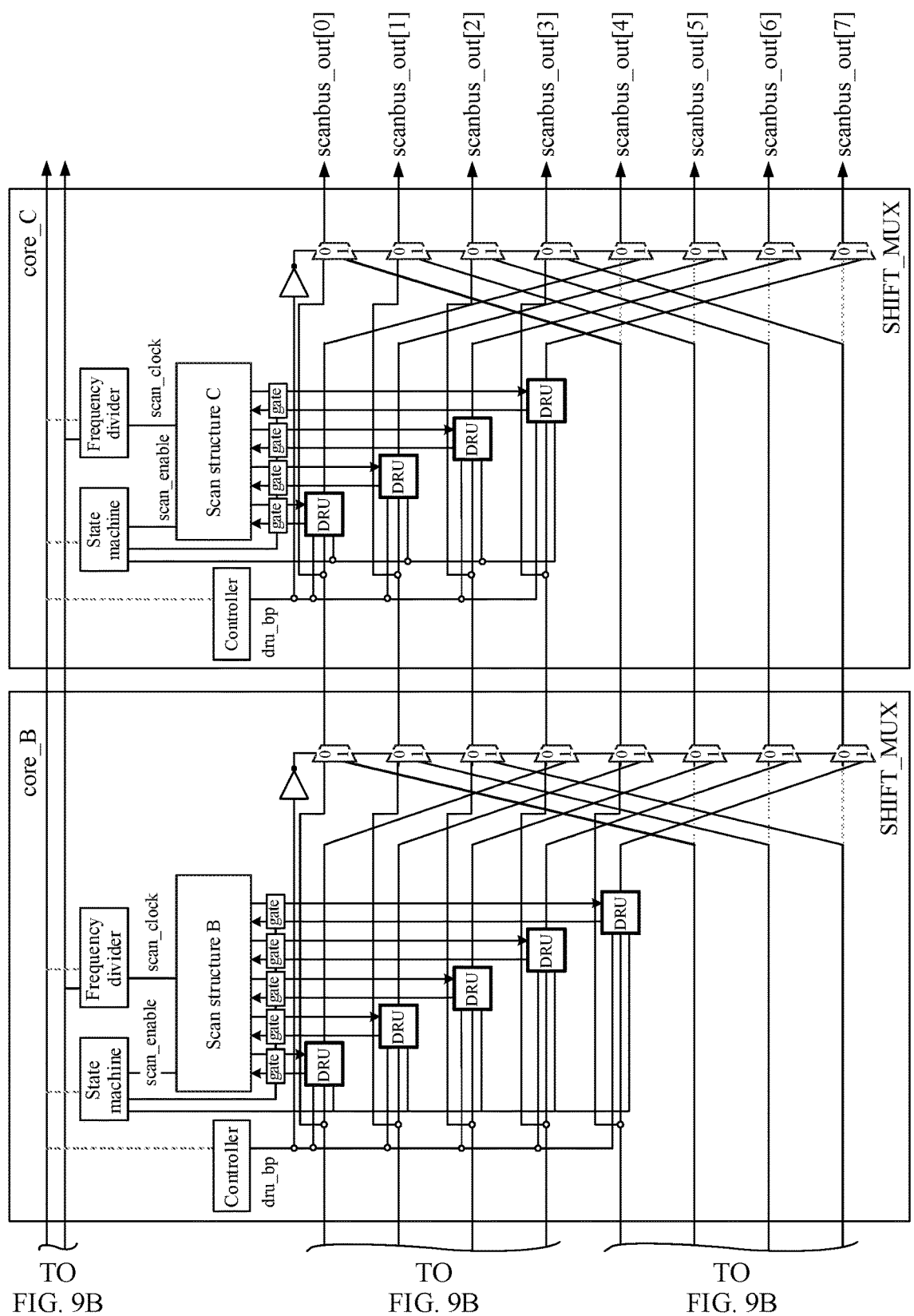
FIG. 9A and FIG. 9B are a schematic diagram 5 of a structure of a tested circuit, a test bus, and a test circuit shown in FIG. 1.
Figure 9B:
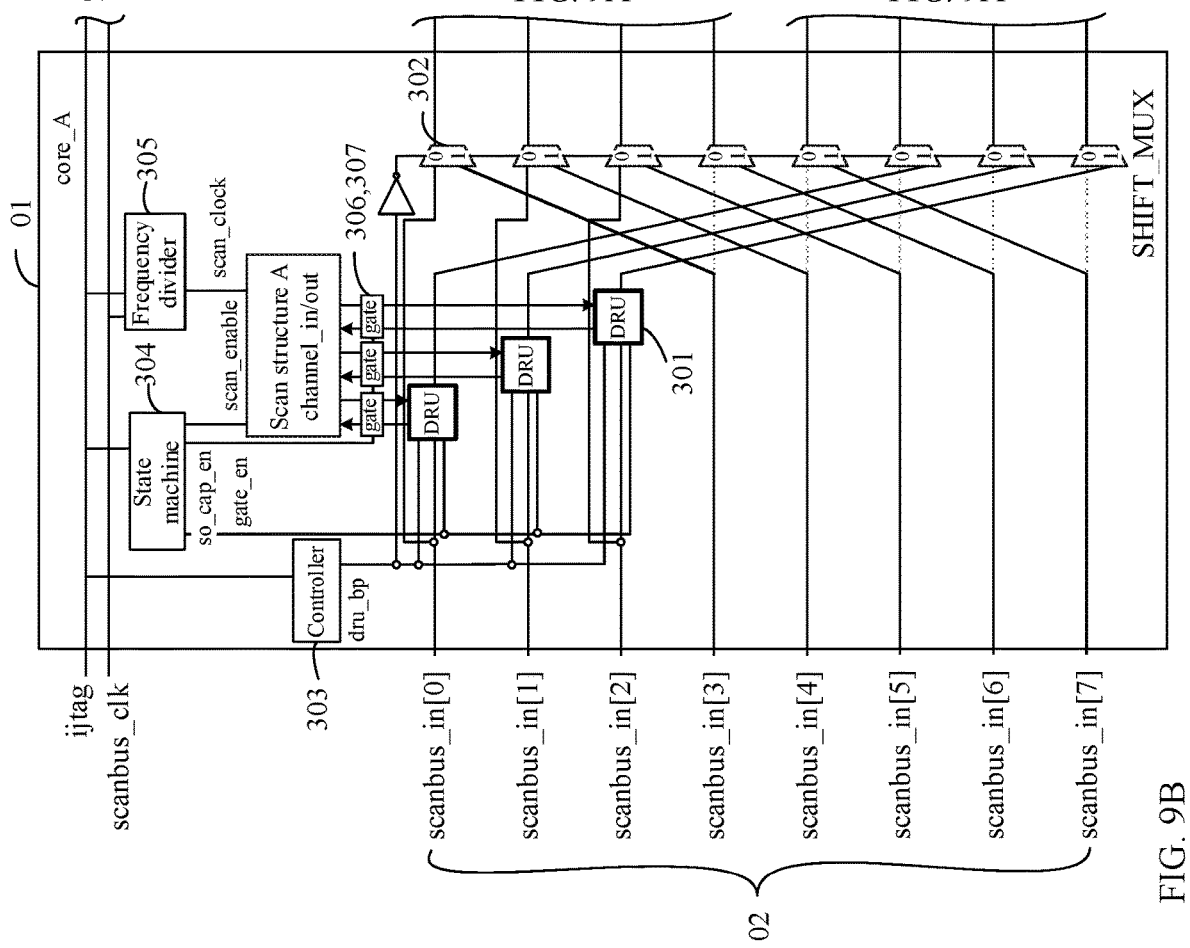

FIG. 2A and FIG. 2B are a schematic diagram 1 of a structure of a tested circuit, a test bus, and a test circuit shown in FIG. 1. FIG. 5A and FIG. 5B are a schematic diagram 2 of a structure of a tested circuit, a test bus, and a test circuit shown in FIG. 1. FIG. 6A and FIG. 6B are a schematic diagram 3 of a structure of a tested circuit, a test bus, and a test circuit shown in FIG. 1. FIG. 7A and FIG. 7B are a schematic diagram 4 of a structure of a tested circuit, a test bus, and a test circuit shown in FIG. 1. FIG. 9A and FIG. 9B are a schematic diagram 5 of a structure of a tested circuit, a test bus, and a test circuit shown in FIG. 1. Refer to FIG. 2A and FIG. 2B, FIG. 5A and FIG. 5B, FIG. 6A and FIG. 6B, FIG. 7A and FIG. 7B, FIG. 9A and FIG. 9B, and FIG. 1. An integrated circuit may include a plurality of functional modules that perform different functions or a same function. All the functional modules need to be tested through a test circuit, to learn whether a function of the functional module can be normally executed. In this case, the functional module may be referred to as a tested circuit 01 in a test process. Therefore, a test circuit in this embodiment of this application may include the plurality of test subcircuits 30 shown in FIG. 1 respectively correspond to the plurality of tested circuits 01. The plurality of test subcircuits 30 shown in FIG. 1 are configured to respectively connect the corresponding tested circuits 01 to the test bus 02. The test bus 02 corresponds to scanbus in FIG. 2A and FIG. 2B, FIG. 5A and FIG. 5B, FIG. 6A and FIG. 6B, FIG. 7A and FIG. 7B, and FIG. 9A and FIG. 9B, where scanbus_in is an input channel of the test bus 02, and scanbus_out is an output channel of the test bus 02.

It should be noted that the test subcircuit 30 shown in FIG. 1 is configured to connect the corresponding tested circuit 01 to the test bus. Each test subcircuit 30 shown in FIG. 1 may include a plurality of data distribution circuits 301. A quantity of the data distribution circuits 301 in each test subcircuit 30 shown in FIG. 1 is related to a quantity of scan channels in the tested circuit 01 corresponding to the test subcircuit. For example, in the example shown in FIG. 2A and FIG. 2B, the quantity of the data distribution circuits 301 in each test subcircuit 30 shown in FIG. 1 is equal to the quantity of the scan channels in a corresponding tested circuit 01. The quantity of the scan channels of the tested circuit 01 is a maximum value of a quantity of scan input channels and a quantity of scan output channels of the tested circuit 01. Therefore, each test subcircuit 30 shown in FIG. 1 may connect the tested circuit 01 to the test bus through the plurality of data distribution circuits 301.

Specifically, the data distribution circuit 301 may also be referred to as a dynamic routing unit (DRU). The data distribution circuit 301 has two input ends and two output ends. A first input end of the data distribution circuit 301 is connected to an input channel scanbus_in of the test bus 02. A second input end is connected to a scan output channel channel_out of the tested circuit 01. A first output end is connected to a scan input channel_in of the tested circuit 01. A second output end is connected to an output channel scanbus_out of the test bus 02.

In the test circuit in this embodiment of this application, the data distribution circuit 301 receives data of the input channel scanbus_in of the test bus 02. The data input into the input channel scanbus_in of the test bus 02 is a test vector required by the tested circuit 01. The data distribution circuit 301 transmits the received data in the input channel scanbus_in of the test bus 02 to a scan structure (scanstucture) of the tested circuit 01 through the scan input channel channel_in of the tested circuit 01. The scan structure of the tested circuit 01 is a structure block used to perform a scanning test on the tested circuit 01 in the tested circuit 01. Both the scan input channel and the scan output channel of the tested circuit 01 are connected to the scan structure in the tested circuit 01. After receiving input data of the scan input channel channel_in, the scan structure performs a scanning test on the tested circuit. After the test is completed, test result data is output through the scan output channel_out in the scan structure. When the scan structure of the tested circuit 01 completes the scanning test, the data distribution circuit 301 outputs the test result data through the scan output channel channel_out of the tested circuit 01, transmits the test result data to the output channel scanbus_out of the test bus 02, and transmits the test result data to test software for comparison with expected test result data, or directly compares the test result data with the expected test result data on a test machine to determine whether the tested circuit 01 is faulty. The test software is EDA software.

In the entire test circuit, the data distribution circuit 301, that is, the DRU, distributes and transfers test data. In a data distribution and transfer process, the data distribution circuit 301 is configured to receive the input data of the input channel scanbus_in of the test bus, and transfer the input data to the scan input channel channel_in of the tested circuit 01. After the test scanning of the tested circuit 01 ends, the data distribution circuit 301 receives the test result data through the scan output channel channel_out of the tested circuit 01, and transmits the test result data to the output channel scanbus_out of the test bus 02 for output to complete the test. A correspondence between the data distribution circuit 301 and the test bus 02 may be dynamically allocated. For example, one data distribution circuit may be connected to a plurality of inputs or outputs of the test bus. An actual connection between the data distribution circuit 301 and the plurality of inputs or outputs of the test bus 02 may be dynamically configured in a multiplexer manner, to achieve an objective of dynamically connecting the data distribution circuit 301 and the test bus 02. Through the dynamic connection relation between the data distribution circuit 301 and the test bus 02, the test bus 02 is dynamically allocated, to meet a requirement of testing a large quantity of tested circuits 01. This resolves line connection, reducing line congestion, and reducing area overheads.

For how the data distribution circuit 301 is dynamically connected to the test bus, embodiments of this application provide a plurality of example embodiments.

Example 1: Refer to FIG. 2A and FIG. 2B. In a schematic diagram of a circuit structure in FIG. 2A and FIG. 2B, in the plurality of test subcircuits 30 shown in FIG. 1, a $j^{th}$ test subcircuit includes Nj data distribution circuits 301 and M first selectors 302. For the first selector 302, refer to a shift selector SHIFT_MUX in FIG. 2A and FIG. 2B. A connection relationship between the first selector 302 and the test bus 02 may be set based on the following relationship: First input ends of first Nj first selectors 302 are sequentially connected to second output ends of the Nj data distribution circuits 301. First input ends of last M-Nj first selectors 302 are sequentially connected to last M-Nj input channels scanbus_in of the test bus 02. In other words, in the $j^{th}$ test subcircuit, when the first selector is configured in a manner so that the first input end of the first selector is connected to the output end, test buses corresponding to the output and the input of the first selector are the same. This is referred to as a direct connection mode. Second input ends of first M-Nj first selectors 302 are sequentially connected to the last M-Nj input channels scanbus_in of the test bus. Second input ends of the Nj first selectors 302 are sequentially connected to the second output ends of the Nj data distribution circuits 301. In other words, in the $j^{th}$ test subcircuit, when the first selector is configured in a manner so that the second input end of the first selector is connected to the output end, the test buses corresponding to the output and the input of the first selector are different. This is referred to as a shift connection mode.

It should be noted that the preset test bus sequence is a sequence or a reverse sequence of a bit sequence of the test bus. The sequence may also be any other preset or specified bus sequence, which is not limited herein. For example, the preset test bus sequence is [0] [2] [4] [6] [1] [3] [5] [7]. [0] is bit [0] (bit) of test bus 02, that is, scanbus_in[0] and scanbus_out[0].

Refer to FIG. 2A and FIG. 2B. In FIG. 2A and FIG. 2B, the first selector 302 is connected to the test bus and the data distribution circuit 301 based on the bit sequence of the test bus. The following describes the example in detail based on the example in FIG. 2A and FIG. 2B.

In FIG. 2A and FIG. 2B, three tested circuits 01 are drawn as an example: a tested circuit A (core_A), a tested circuit B (core_B), and a tested circuit C (core_C). Three test subcircuits 30 shown in FIG. 1 are respectively a first test subcircuit corresponding to the tested circuit A, a second test subcircuit corresponding to the tested circuit B, and a third test subcircuit corresponding to the tested circuit C.

It should be noted that, in the example shown in FIG. 2A and FIG. 2B, although the first, the second, and the third test subcircuits corresponding to the tested circuit A, the tested circuit B, and the tested circuit C are respectively disposed inside the tested circuit A, the tested circuit B, and the tested circuit C, actually, circuit structures of the tested circuit A, the tested circuit B, and the tested circuit C may not include corresponding test subcircuits. In other words, the test subcircuits corresponding to the tested circuit A, the tested circuit B, and the tested circuit C are set inside the tested circuit A, the tested circuit B, and the tested circuit C only in a circuit position relationship.

In addition, the test subcircuits corresponding to the tested circuit A, the tested circuit B, and the tested circuit C may be disposed outside the tested circuit A, the tested circuit B, and the tested circuit C. For example, refer to a circuit structure shown in FIG. 5A and FIG. 5B. Regardless of whether the test subcircuit 30 shown in FIG. 1 is disposed inside or outside the tested circuit 01, the test subcircuit 30 does not affect the test circuit and circuit running of the tested circuit 01. Therefore, this embodiment does not limit whether the test circuit 03 shown in FIG. 1 and the test subcircuit 30 shown in FIG. 1 are disposed inside the tested circuit 01.

In FIG. 2A and FIG. 2B, a scan structure of the tested circuit A has three scan input channels channel_in, which are respectively channel_in[0], channel_in[1], and channel_in[2]; and three scan output channels channel_out, which are respectively channel_out[0], channel_out[1], and channel_out[2] (refer to channel_in/out in the scan structure A in FIG. 2A and FIG. 2B, and a detailed correspondence is not shown in FIG. 2A and FIG. 2B).

A scan structure of the tested circuit B has five scan input channels channel_in, which are respectively channel_in[0], channel_in[1], channel_in[2], channel_in[3] and channel_in[4]; and five scan output channels channel_out, which are respectively channel_out[0], channel_out[1], channel_out[2], channel_out[3] and channel_out[4] (not shown in FIG. 2A and FIG. 2B).

A scan structure of the tested circuit C has four scan input channels channel_in, which are respectively channel_in[0], channel_in[1], channel_in[2] and channel_in[3]; and four scan output channels channel_out, which are respectively channel_out[0], channel_out[1], channel_out[2] and channel_out[3] (not shown in FIG. 2A and FIG. 2B).

Therefore, a first test subcircuit corresponding to tested circuit A has three data distribution circuits 301. A second test subcircuit corresponding to tested circuit B has five data distribution circuits 301. A third test subcircuit corresponding to tested circuit C has four data distribution circuits 301.

For example, a bit width of the test bus in FIG. 2A and FIG. 2B is eight bits. First input ends of three data distribution circuits 301 in the first test subcircuit are respectively connected to first three bits of the test bus, that is, scanbus_in[0], scanbus_in[1], and scanbus_in[2]. By analogy, first input ends of five data distribution circuits 301 in the second test subcircuit are respectively connected to first five bits of the test bus, that is, scanbus_in[0], scanbus_in[1], scanbus_in[2], scanbus_in[3] and scanbus_in[4]. First input ends of four data distribution circuits 301 in the third test subcircuit are respectively connected to first four bits of the test bus, that is, scanbus_in[0], scanbus_in[1], scanbus_in[2] and scanbus_in[3].

For the first selector 302, in this example, a quantity of first selectors 302 corresponding to each test subcircuit is equal to the bit width of the test bus. In other words, the quantity of first selectors 302 corresponding to each test subcircuit is eight.

Therefore, in the first test subcircuit corresponding to the tested circuit A, first input ends of first three first selectors 302 are connected to second output ends of the three data distribution circuits 301. First input ends of the last five first selectors 302 are connected to inputs scanbus_in of last five test buses, that is, scanbus_in[3], scanbus_in[4], scanbus_in[5], scanbus_in[6] and scanbus_in[7] of the test buses. Second input ends of first five first selectors 302 are connected to inputs scanbus_in of last five test buses, that is, connected to scanbus_in[3], scanbus_in[4], scanbus_in[5], scanbus_in[6] and scanbus_in[7] of the test buses. Second input ends of last three first selectors 302 are connected to second input ends of three data distribution circuits 301.

By analogy, in the second test subcircuit corresponding to the tested circuit B, first input ends of the first five first selectors 302 are connected to second output ends of five data distribution circuits 301. First input ends of the last three first selectors 302 are connected to inputs scanbus_in of last three test buses, that is, scanbus_in[5], scanbus_in[6] and scanbus_in[7] of the test buses. Second input ends of the first three first selectors 302 are connected to inputs scanbus_in of the last three test buses, that is, scanbus_in[5], scanbus_in[6] and scanbus_in[7] of the test buses. Second input ends of the last five first selectors 302 are connected to second input ends of the five data distribution circuits 301.

In the third test subcircuit corresponding to the tested circuit C, first input ends of first four first selectors 302 are connected to second output ends of four data distribution circuits 301. First input ends of last four first selectors 302 are connected to inputs scanbus_in of last four test buses, that is, scanbus_in[4], scanbus_in[5], scanbus_in[6] and scanbus_in[7] of the buses. Second input ends of the first four first selectors 302 are connected to the inputs scanbus_in of the last four test buses, that is, scanbus_in[4], scanbus_in[5], scanbus_in[6] and scanbus_in[7] of the test buses. Second input ends of the last four first selectors 302 are connected to second input ends of the four data distribution circuits 301.

It should be understood that, in this example, to control the first selector 302 to select whether the first input end is connected to the output end or the second input end is connected to the output end, a control end of the first selector 302 receives a shift selection control signal bus_shift for control. The shift selection control signal bus_shift is configured and generated by a controller 303, that is, corresponds to a first signal interface of the controller 303. The controller 303 may be configured by using an IEEE 1687 standard (Internal JTAG, IJTAG) protocol pin.

When the shift selection control signal bus_shift indicates the first selector 302 to select the first input end to connect to the output end, the input scanbus_in and the output scanbus_out of the test bus in the test subcircuit are in a direct connection mode. For example, scanbus_in[0] of the test bus corresponds to scanbus_out[0] of the test bus, and so on.

When the shift selection control signal bus_shift indicates the first selector 302 to select the second input end to connect to the output end, input scanbus_in and output scanbus_out of the test bus in the test subcircuit are in a shift connection mode. In other words, corresponding to the example in FIG. 2A and FIG. 2B, in the first test subcircuit, scanbus_in[0] of the test bus corresponds to the test bus scanbus_out[5]. scanbus_in[3] of the test bus corresponds to scanbus_in[0] of the test bus, and so on.

It should be noted that, in such a shift connection manner, in some test scenarios, the tested circuit 01 may not participate in the test. For the tested circuit 01 that does not participate in the test, a bus in the test subcircuit 30 shown in FIG. 1 corresponding to the tested circuit 01 uses a direct connection mode, so that the tested circuit 01 participating in the test can keep continuous in bus resources allocation. This reduces complexity of test circuit configuration.

In the example shown in FIG. 2A and FIG. 2B, it is assumed that the tested circuit B does not participate in the test, the shift selection control signal bus_shift in the test subcircuit corresponding to the tested circuit B is controlled to instruct the first selector 302 to select the first input end to be connected to the output end. This is referred to as the direct connection mode. Therefore, the input channels of the test bus used by tested circuit A are scanbus_in[0], scanbus_in[1], and scanbus_in[2] of the test bus 02. The output channels are scanbus_out[1], scanbus_out[2], and scanbus_out[3] of the test bus 02. The input channels of the test bus used by tested circuit B are scanbus_in[3], scanbus_in[4], scanbus_in[5] and scanbus_in[6] of the test bus 02. The output channels are scanbus_out[4], scanbus_out[5], scanbus_out[6] and scanbus_out[7] of the test bus 02.

Figure 3:
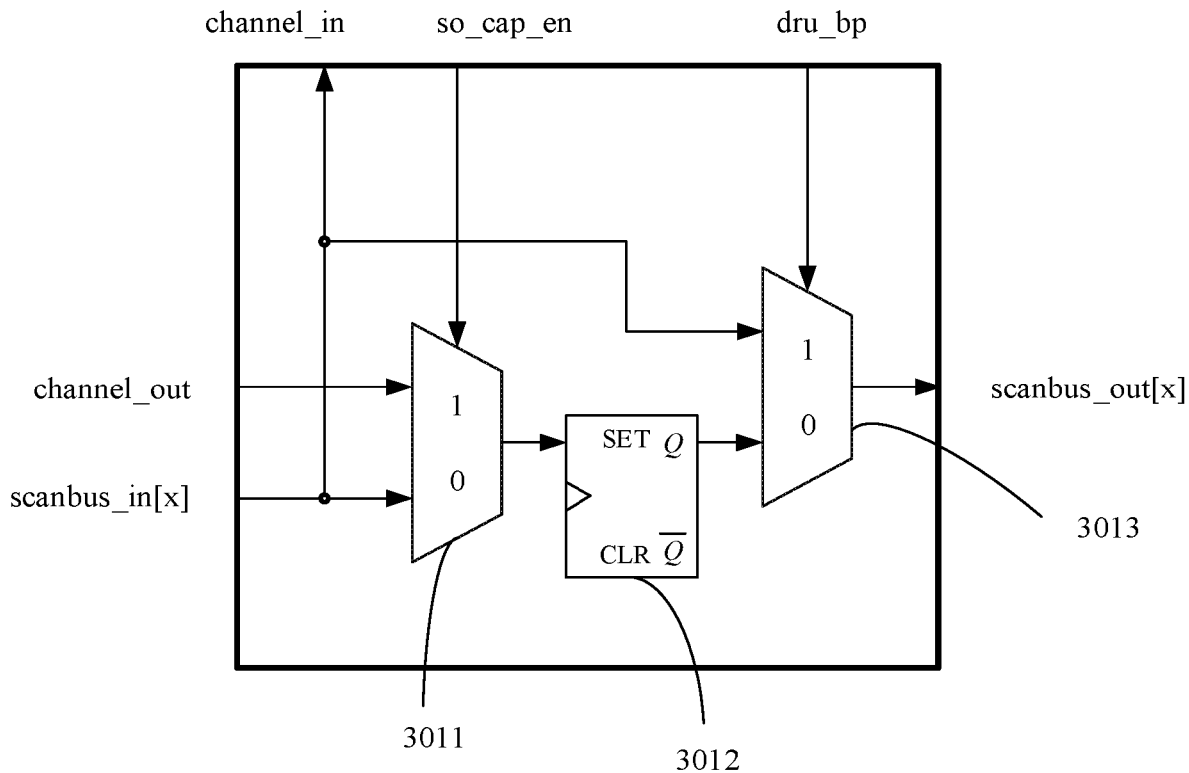
FIG. 3 is a schematic diagram of a structure of a data distribution circuit in a test circuit according to an embodiment of this application.

FIG. 3 is a schematic diagram of a structure of a data distribution circuit 301 in a test circuit according to this embodiment, and is applicable to Example 1 shown in FIG. 2A and FIG. 2B. Refer to FIG. 3. Each data distribution circuit 301 includes a fourth selector 3011, a register 3012, and a fifth selector 3013.

The fourth selector 3011 is configured to enable the data distribution circuit 301 to choose whether to receive data from the test bus 02 or from the corresponding scan output channel channel_out of the tested circuit 01. In other words, a first input end and a second input end of the fourth selector 3011 are respectively connected to a first input end and a second input end of the data distribution circuit 301. A control end of the fourth selector 3011 is connected to a first control end of the data distribution circuit 301, and is configured to control selecting and inputting bus data to the data distribution circuit 301, or selecting and inputting corresponding scan output data of the tested circuit 01 to the data distribution circuit 301.

The register 3012 is configured to temporarily store the data received by the data distribution circuit 301. Therefore, an input end of the register 3012 is connected to an output end of the fourth selector 3011. An output end of the register 3012 is connected to the first input end of the fifth selector 3013.

The fifth selector 3013 is configured to implement configuration of whether input data of the test bus 02 passes through the register 3012. In other words, a second input end of the fifth selector 3013 is connected to the first input end of the data distribution circuit 301. An output end of the fifth selector 3013 is connected to a second output end of the data distribution circuit 301. A control end of the fifth selector 3013 is connected to a second control end of the data distribution circuit 301.

A first output end of the data distribution circuit 301 is connected to the first input end of the data distribution circuit 301, the output end of the register 3012, or the second output end of the data distribution circuit 301.

In a case in which the tested circuit 01 that does not participate in the test exists, to reduce test time, the fifth selector 3013 is disposed in the foregoing data distribution circuit 301. The fifth selector 3013 is an alternative selector, and a bypass enabling signal dru_bp is generated through configuration by the controller 303. In other words, corresponding to the second signal interface of the controller 303, the first input end of the fifth selector 3013 is controlled to be connected to the output end of the fifth selector 3013, or the second input end of the fifth selector 3013 is controlled to be connected to the output end of the fifth selector 3013. When the bypass enabling signal dru_bp indicates the fifth selector 3013 to select the first input end to connect to the output end of the fifth selector 301, the data distribution circuit 301 is in a bypass state. In other words, the first input end and the second output end of the data distribution circuit 301 are directly connected. Therefore, when a tested circuit 01 does not participate in the test, all data distribution circuits 301 in a test subcircuit corresponding to the tested circuit 01 are set to a bypass state, and no additional time period is occupied in a data transmission process. This reduces test time.

Example 2: Refer to FIG. 6A and FIG. 6B. In a schematic diagram of a circuit structure in FIG. 6A and FIG. 6B, the $j^{th}$ test subcircuit of the plurality of test subcircuits 30 shown in FIG. 1 includes M data distribution circuits 301, M second selectors 308, and $CI_j$ third selectors 309. The $j^{th}$ test subcircuit may be any test subcircuit in the plurality of test subcircuits. For the second selector 308, refer to a scan output selector SO_MUX in FIG. 6A and FIG. 6B. For the third selector 309, refer to a scan input selector SI_MUX in FIG. 6A and FIG. 6B. Both the quantity of data distribution circuits 301 in the $j^{th}$ test subcircuit and the quantity M of second selectors 308 are equal to a bit width of the test bus. The quantity $CI_j$ of third selectors 309 in the $j^{th}$ test subcircuit is equal to the quantity of scan input channels channel_in of the tested circuit 01 corresponding to the $j^{th}$ test subcircuit. First input ends of the M data distribution circuits 301 are respectively connected to M input channels scanbus_in of the test bus 02. In other words, the first input end of the data distribution circuit 301 is configured to receive scan test data of the test bus 02. Second output ends of the M data distribution circuits 301 are respectively connected to M output channels scanbus_out of the test bus.

In the $j^{th}$ test subcircuit, $CO_j$ input ends of each second selector 308 in the M second selectors 308 are respectively connected to $CO_j$ scan output channels channel_out of the tested circuit 01 corresponding to the $j^{th}$ test subcircuit. Output ends of the M second selectors 308 are respectively connected to second input ends of the M data distribution circuits 301 in the test subcircuit. The second selector 308 is a one-of-many multiplexer. A quantity of input ends of the second selector 308 is related to a quantity of scan output channels channel_out of the tested circuit 01 corresponding to the $j^{th}$ test subcircuit. For example, if the quantity of scan output channels channel_out of the tested circuit 01 is three, the second selector 308 may select a one-of-three multiplexer, configured to select a data distribution circuit 301 corresponding to each scan output channel channel_out of the tested circuit 01, and an input channel scanbus_in or an output channel scanbus_out of the corresponding test bus 02.

In the $j^{th}$ test subcircuit, M input ends of each third selector 309 of the $CI_j$ third selectors 309 are respectively connected to first output ends of the M data distribution circuits 301. Output ends of the $CI_j$ third selectors 309 are respectively connected to CIj scan input channels channel_in of the tested circuit 01 corresponding to the $j^{th}$ test subcircuit. The third selector 309 is also a one-of-many multiplexer. A quantity of input ends of the third selector 309 is related to a quantity of data distribution circuits 301 corresponding to the $j^{th}$ test subcircuit. The quantity of the data distribution circuits 301 is related to the bit width of the test bus 02. For example, if the bit width of the test bus 02 is eight bits, the third selector 309 may be a one-of-eight multiplexer, configured to select the data distribution circuit 301 corresponding to the scan input channel channel_in of the tested circuit 01, and the input channel scanbus_in or the output channel scanbus_out of the corresponding test bus 02.

In this example, the second selector 308 is used to configure the scan output channel channel_out of the tested circuit 01 to select a connected data distribution circuit 301, and the third selector 309 is used to configure the scan input channel channel_in of the tested circuit 01 to select the connected data distribution circuit 301. Corresponding to each test subcircuit 30 shown in FIG. 1, a data distribution circuit 301 is disposed on each bit of the test bus. Therefore, the second selector 308 and the third selector 309 are configured, not only bus resources can be resolved to resolve a problem of winding congestion, but also allocation of each scan channel of the tested circuit 01 to any bus resource can be implemented, so that allocation of bus resources is more flexible.

Corresponding to the example in FIG. 6A and FIG. 6B, both the second selector 308 and the third selector 309 are one-of-many multiplexers. The second selector 308 and the third selector 309 are configured by using a signal generated by the controller 303. In this case, the second selector 308 corresponds to a scan output selection signal so_select. The third selector 309 corresponds to a scan input selection signal si_select. In the controller 303, the scan output selection signal so_select is generated through the third signal interface, and the scan input selection signal si_select is generated through the fourth signal interface. In other words, the scan output selection signal so_select is output through the third signal interface of the controller 303. The second selector 308 is configured by using the scan output selection signal so_select. A corresponding data distribution circuit 301 is selected to receive the scan output data of the tested circuit 01. Similarly, the scan input selection signal si_select is output through the fourth signal interface of the controller 303. The third selector 309 is configured by using the scan input selection signal si_select. The corresponding data distribution circuit 301 is selected to transmit the scan test data to the scan input channel channel_in of the tested circuit 01. In this configuration manner, configuration of the test circuit is simple and easy.

Refer to FIG. 6A and FIG. 6B. Taking the tested circuit A in FIG. 6A and FIG. 6B as an example, the second selector 308 is a one-of-three selector. Therefore, the scanning output selection signal so_select should be actually a two-digit signal, and output values are 00, 01, and 10 respectively. These signals respectively correspond to a scan output channel of the tested circuit A. The third selector 309 is a one-of-eight selector. Therefore, the scan input selection signal si_select should be actually a three-digit signal, and output values are 000, 001, 010, 011, 100, 101, 110 and 111 respectively. These signals respectively correspond to a data distribution circuit in the test subcircuit corresponding to tested circuit A.

It should be further noted that, in the example in FIG. 6A and FIG. 6B, there are a plurality of second selectors 308 and a plurality of third selectors 309. Therefore, corresponding to each second selector 308, there is one scan output selection signal so_select (only one scan output selection signal so_select is shown as an example in the figure). Corresponding to each third selector 309, there is one scan input selection signal si_select (only one scan input selection signal si_select is shown as an example in the figure).

In addition, corresponding to the example in FIG. 6A and FIG. 6B, for a structure of the data distribution circuit 301 in FIG. 6A and FIG. 6B, refer to the structure of the data distribution circuit 301 shown in FIG. 3. Details are not described herein again.

Example 3: Refer to FIG. 7A and FIG. 7B. In a schematic diagram of a circuit structure in FIG. 7A and FIG. 7B, the $j^{th}$ test subcircuit of the plurality of test subcircuits 30 shown in FIG. 1 includes Nj groups of data distribution circuits 301 and $CI_j$ OR gates 310. The $j^{th}$ test subcircuit may be any one of the plurality of test subcircuits. The quantity Nj of groups of data distribution circuits in the $j^{th}$ test subcircuit is a quantity of scan channels of the corresponding tested circuit, that is, a maximum value between a quantity $CI_j$ of scan input channels channel_in and a quantity $CO_j$ of scan output channels channel_out of the corresponding tested circuit. $Nj=max(CI_j, CO_j)$.

The $CI_j$ OR gates 310 are respectively corresponding to $CI_j$ groups of data distribution circuits 301 in the Nj groups of data distribution circuits 301. The $CI_j$ OR gates 310 are respectively corresponding to the $CI_j$ scan input channels channel_in of the tested circuit 01. $CO_j$ groups of data distribution circuits 301 in the Nj groups of data distribution circuits 301 respectively correspond to the $CO_j$ scan output channels channel_out of the tested circuit 01. For example, the quantity of scan channels of the tested circuit 01 is four, and the quantity of scan channels is a maximum value of the quantity of the scan input channels channel_in and the quantity of the scan output channels channel_out. Therefore, the quantity of groups of data distribution circuits 301 in the test subcircuit corresponding to the tested circuit 01 is four. Each group of data distribution circuits 301 may correspond to one scan input channel channel_in and one scan output channel channel_out. The quantity of OR gates in the test subcircuit is the quantity of scan input channels channel_in, that is, three. Therefore, each OR gate 301 also corresponds to a group of data distribution circuits 301, and corresponds to a scan input channel channel_in of the tested circuit 01.

In the $j^{th}$ test subcircuit, each group of data distribution circuits 301 includes M data distribution circuits 301. The M data distribution circuits 301 are respectively connected to a test bus of M bits.

Each group of data distribution circuits in the Nj groups of data distribution circuits 301 are serially connected to the corresponding test bus through a first input end and a second output end of each data distribution circuit 301 in sequence. In other words, a plurality of data distribution circuits 301 on the same test bus 02 are connected to the same test bus 02 through the first input end and the second output end in sequence.

First output ends of the M data distribution circuits 301 in each group of data distribution circuits 301 are connected to M input ends of corresponding OR gates 310. Output ends of the OR gates 310 are connected to corresponding scan input channels channel_in of the tested circuit 01.

Second input ends of the M data distribution circuits 301 in each group of data distribution circuits 301 are connected to a corresponding scan output channel channel_out of the tested circuit 01.

Each data distribution circuit 301 is further configured to control reset of the data distribution circuit 301. When the data distribution circuit 301 is reset, output of the data distribution circuit 301 is zero. In each group of data distribution circuits 301, an output value of the OR gate 310 is a value output by the first output end of the selected data distribution circuit 301, that is, a value input by the input channel scanbus_in of the selected test bus 02.

In Example 3, an OR gate 310 is disposed between the scan input channel channel_in of the tested circuit 01 and the data distribution circuit 301 connected to the test bus. The data transmitted to the scan input channel channel_in of the tested circuit 01 is selected through the OR gate 310. In this way, area overheads can be reduced as much as possible, and a winding congestion problem can be resolved. In addition, by performing a reset operation on unselected data distribution circuits 301, the output value of each OR gate 310 may be the value output by the first output end of the selected data distribution circuit 301, thereby implementing more flexible test bus resources allocation.

Corresponding to the example in FIG. 7A and FIG. 7B, to reset the data distribution circuit 301, a reset signal needs to be configured. Because the reset signal and the bypass enabling signal dru_bp are associated signals, the reset signal and the bypass enabling signal dru_bp may be shared, that is, generated through the second signal interface of the controller 303. In other words, the bypass enabling signal dru_bp is output through the second signal interface of the controller 303, to configure the fifth selector 3013 in the data distribution circuit 301, set an unselected data distribution circuit 301 in the test subcircuit to bypass, and control the register 3012 of the data distribution circuit 301 to reset, to meet a requirement of the scan input channel_in of the tested circuit 01 for selecting one of the data distribution circuits 301. A configuration operation is simple.

It should be noted that the bypass enabling signal dru_bp in the example shown in FIG. 7A and FIG. 7B is a multi-bit signal, and each data distribution circuit in each test submodule corresponds to one bit of the bypass enabling signal dru_bp.

Figure 8:
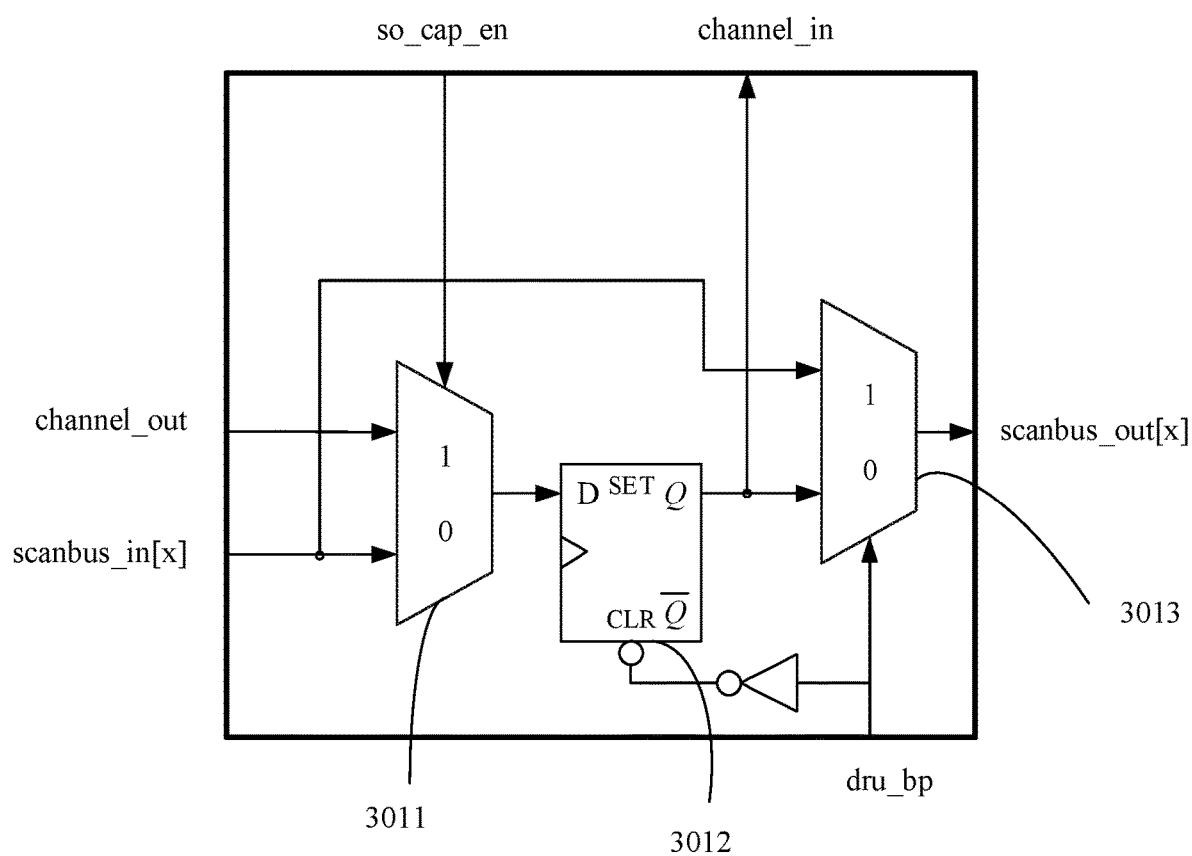
FIG. 8 is a schematic diagram of a structure of a data distribution circuit in FIG. 7A and FIG. 7B.

FIG. 8 is a schematic diagram of a structure of a data distribution circuit 301 corresponding to FIG. 7A and FIG. 7B. Different from the data distribution circuit 301 shown in FIG. 3, a second control end in the data distribution circuit 301 shown in FIG. 7A and FIG. 7B is further connected to a reset end of a register 3012, and is configured to control the register 3012 to perform reset. It should be noted that a reset signal and a bypass enabling signal may be opposite signals. If a trigger level of the reset signal is opposite to that of the bypass enabling signal, a NOT operation may be performed on the bypass enabling signal, and then the bypass enabling signal is transmitted to a control end of the register 301 to perform a reset operation.

Example 4: Refer to FIG. 9A and FIG. 9B. In the schematic diagram of the circuit structure in FIG. 9A and FIG. 9B, there are a plurality of test subcircuits respectively corresponding to the plurality of tested circuits 01. The plurality of test subcircuits 30 shown in FIG. 1 are configured to respectively connect the corresponding tested circuits 01 to the test bus. The $j^{th}$ test subcircuit of the plurality of test subcircuits 30 shown in FIG. 1 includes the Nj data distribution circuits 301 and the M first selectors 302. For the first selector 302, refer to the shift selector SHIFT_MUX in FIG. 2A and FIG. 2B. The $j^{th}$ test subcircuit may be any one of the plurality of test subcircuits 30 shown in FIG. 1. The quantity Nj of data distribution circuits in the $j^{th}$ test subcircuit is a quantity of scan channels of the corresponding tested circuit, that is, a maximum value between a quantity $CI_j$ of scan input channels and a quantity $CO_j$ of scan output channels of the corresponding tested circuit. $Nj=max(CI_j, CO_j)$.

In the $j^{th}$ test subcircuit, first input ends of the Nj data distribution circuits 301 are respectively connected to Nj input channels scanbus_in of the test bus. In other words, the first input end of the data distribution circuit 301 is configured to receive scan test data input by the input channel scanbus_in of the test bus 02. First output ends of $CI_j$ data distribution circuits 301 in the Nj data distribution circuits 301 are respectively connected to the $CI_j$ scan input channels channel_in of the tested circuit 01 corresponding to the $j^{th}$ test subcircuit. In other words, a first output end of the data distribution circuit 301 is configured to transmit the scan test data received from the test bus 02 to a corresponding scan input channel channel_in of the tested circuit 01. Second input ends of $CO_j$ data distribution circuits 301 in the Nj data distribution circuits 301 are respectively connected to the $CO_j$ scan output channels channel_out of the tested circuit 01 corresponding to the $j^{th}$ test subcircuit. In other words, a second input end of the data distribution circuit 301 is configured to receive test result data output by a corresponding scan output channel channel_out of the tested circuit 01. The test result data is output to the output channel scanbus_out of the test bus 02 through a second output end of the data distribution circuit 301.

A quantity M of first selectors 302 of each test subcircuit in the plurality of test subcircuits shown in FIG. 1 is equal to a bit width of the test bus 02. Output ends of the M first selectors 302 in each test subcircuit are respectively connected to the M output channels scanbus_out of the test bus 02. The M first selectors 302 in each test subcircuit respectively correspond to M bits of the test bus 02.

First input ends of the M first selectors 302 are respectively connected to M input channels scanbus_in of the test bus 02. Second input ends of Nj first selectors 302 of the M first selectors 302 are respectively connected to the second output ends of the Nj data distribution circuits 301. Second input ends of the remaining M-Nj first selectors 302 are respectively connected to the input channels scanbus_in of the M-Nj test buses on which no data distribution circuit 301 is disposed. The first input end and the second output end of each first selector 302 are connected to different buses.

A line structure of the test subcircuit 30 shown in FIG. 1 in this example is similar to that in the first example shown in FIG. 2A and FIG. 2B. A difference lies in that the first input ends of the M first selectors 302 are all connected to the M inputs of the test bus. In the $j^{th}$ test subcircuit, the first input end of the first selector is directly connected to the input of the test bus, so that when the tested circuit corresponding to the $j^{th}$ test subcircuit does not participate in the test, input data of the $(j+1)^{th}$ test subcircuit does not pass through the data distribution circuit in the $j^{th}$ test subcircuit. This reduces test time.

In Example 4, in the test circuit, test resources are allocated and transferred through the data distribution circuit 301. The first selector 302 is configured in a manner so that the test resources can be dynamically allocated. This greatly resolves a winding congestion problem, and simplifies a configuration process.

Optionally, in the $j^{th}$ test subcircuit of the plurality of test subcircuits 30 shown in FIG. 1, based on a preset test bus sequence, first input ends of the Nj data distribution circuits 301 are sequentially connected to input channels scanbus_in of first Nj buses. First input ends of the M first selectors 302 are sequentially connected to M inputs of the test bus. Second input ends of first M-Nj first selectors 302 are connected to last M-Nj inputs of the test bus in sequence. Second input ends of last Nj first selectors 302 are sequentially connected to the second output ends of the Nj data distribution circuits 301. In the foregoing possible implementation, the data distribution circuit 301 is allocated to bus resources in the preset sequence according to a given rule, so that the test circuit can simplify line design and facilitate wiring while ensuring dynamic allocation of test resources.

For the explanation of the preset test bus sequence, refer to Example 1 shown in FIG. 2A and FIG. 2B. Details are not described herein again.

It should be noted that, corresponding to Example 4 shown in FIG. 9A and FIG. 9B, because the first input end of the first selector 302 is directly connected to the input scanbus_in of the bus, when the first selector 302 is configured to select the first input end and the output end to be connected, the test bus connected to the first selector 302 is actually in a direct connection state, and does not pass through the data distribution circuit 301.

Figure 10:
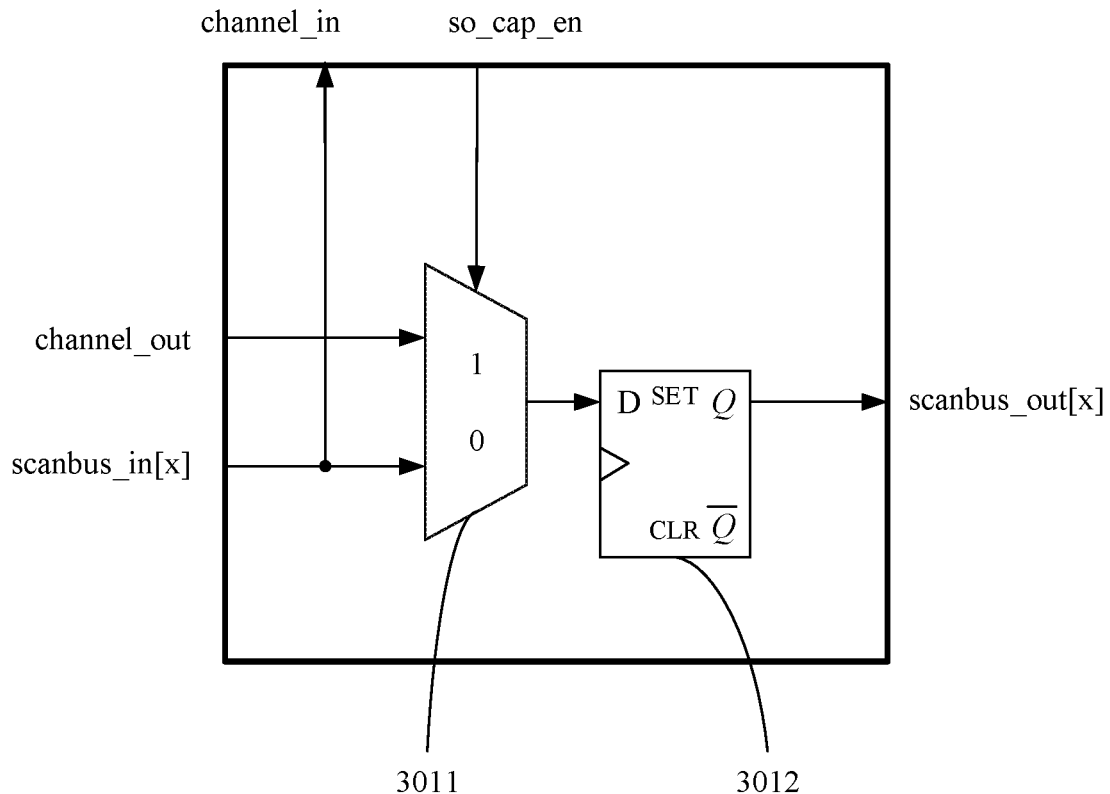
FIG. 10 is a schematic diagram of a structure of a data distribution circuit in FIG. 9A and FIG. 9B.

Corresponding to Example 4 in FIG. 9A and FIG. 9B, FIG. 10 is a schematic diagram of a structure of the data distribution circuit in FIG. 9A and FIG. 9B. Refer to FIG. 10, each data distribution circuit 301 includes a fourth selector 3011 and a register 3012. A first input end and a second input end of the fourth selector 3011 are respectively connected to a first input end and a second input end of the data distribution circuit 301. A control end of the fourth selector 3011 is connected to a first control end of the data distribution circuit 301. An input end of the register 3012 is connected to an output end of the fourth selector 3011. An output end of the register 3012 is connected to a second output end of the data distribution circuit 301. A first output end of the data distribution circuit 301 is connected to the first input end of the data distribution circuit 301 or an output end of the register 3012.

In addition, configuration of the first selector 302 may still be controlled by using a shift selection control signal bus_shift generated by the controller 303. For details, refer to Example 1 shown in FIG. 2A and FIG. 2B. Details are not described herein again.

Figure 4:
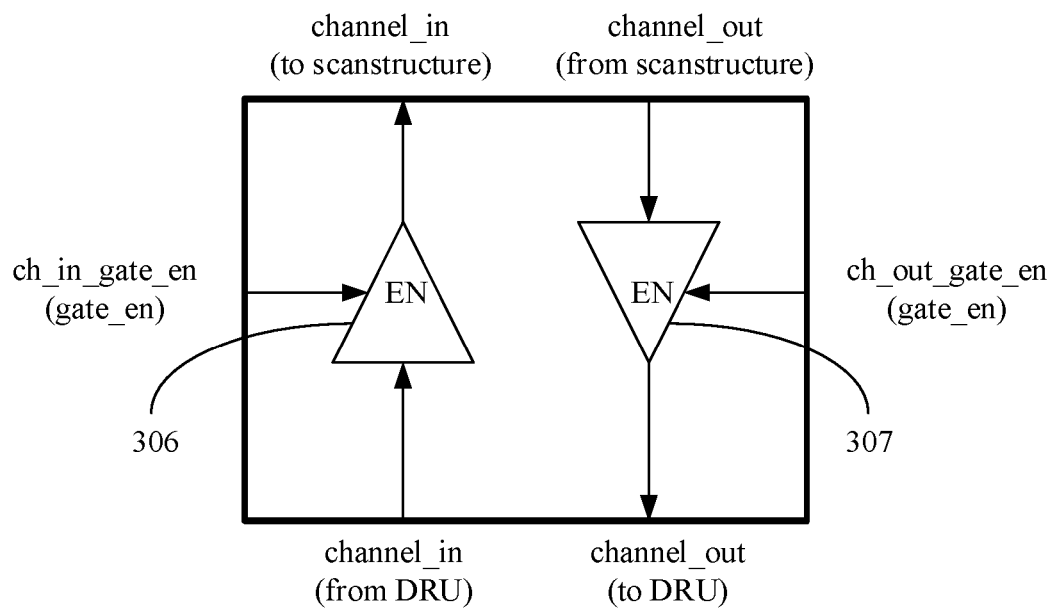
FIG. 4 is a schematic diagram of a structure of a gating circuit in a test circuit according to an embodiment of this application.

It should be further noted that FIG. 4 is a schematic diagram of a structure of a gating circuit in a test circuit according to an embodiment of this application. The gating circuit may correspond to the gating unit gate in FIG. 2A and FIG. 2B, FIG. 5A and FIG. 5B, FIG. 6A and FIG. 6B, FIG. 7A and FIG. 7B, and FIG. 9A and FIG. 9B. To enable effective data transmission, gating circuits are disposed when the data distribution circuit 301 transmits data to the scan input channel channel_in of the tested circuit 01 and when the scan output channel channel_out of the tested circuit 01 transmits data to the data distribution circuit 301, which are respectively a first gate control circuit 306 and a second gating circuit 307. As shown in FIG. 4, the first gate control circuit 306 and the second gating circuit 307 are integrated together. In an actual circuit, the first gate control circuit 306 and the second gating circuit 307 may also be separated into two circuit modules.

Corresponding to Example 1 in FIG. 2A and FIG. 2B and FIG. 5A and FIG. 5B and Example 4 in FIG. 9A and FIG. 9B, in the $j^{th}$ test subcircuit of the plurality of test subcircuits 30 shown in FIG. 1, the data distribution circuit 301 is connected to the scan input channel channel_in of the tested circuit 01 corresponding to the $j^{th}$ test subcircuit through the first gate control circuit 306, and is configured to control whether data in the data distribution circuit 301 is output to the scan input channel channel_in of the tested circuit 01 corresponding to the $j^{th}$ test subcircuit. The data distribution circuit 301 is connected to the scan output channel channel_out of the tested circuit 01 corresponding to the $j^{th}$ test subcircuit through the second gating circuit 307, and is configured to control whether data of the scan output channel channel_out of the tested circuit 01 corresponding to the $j^{th}$ test subcircuit is output to the data distribution circuit 301.

For example, in the $j^{th}$ test subcircuit, first output ends of $CI_j$ data distribution circuits 301 in the Nj data distribution circuits 301 are respectively connected to input ends of $CI_j$ first gate control circuits 306. Output ends of the $CI_j$ first gate control circuits 306 are respectively connected to $CI_j$ scan input channels channel_in of the tested circuit 01 corresponding to the $j^{th}$ test subcircuit. In the $j^{th}$ test subcircuit, $CO_j$ scan output channels channel_out of the tested circuit 01 corresponding to the $j^{th}$ test subcircuit are respectively connected to input ends of $CO_j$ second gating circuits 307. Output ends of the $CO_j$ second gating circuits 307 are respectively connected to second input ends of $CO_j$ data distribution circuits 301 in the Nj data distribution circuits 301.

Corresponding to Example 2 in FIG. 6A and FIG. 6B, in the $j^{th}$ test subcircuit of the plurality of test subcircuits 30 shown in FIG. 1, the third selector 309 is connected to the scan input channel_in of the tested circuit 01 corresponding to the $j^{th}$ test subcircuit through the first gate control circuit 306, and is configured to control whether data in the data distribution circuit 301 is output to the scan input channel_in of the tested circuit 01 corresponding to the $j^{th}$ test subcircuit. The scan output channel channel_out of the tested circuit 01 corresponding to the $j^{th}$ test subcircuit is connected to the second selector 308 through the second gating circuit 307, and is configured to control whether data of the scan output channel channel_out of the tested circuit 01 corresponding to the $j^{th}$ test subcircuit is output to the data distribution circuit 301.

For example, the $CO_j$ scan output channels channel_out of the tested circuit 01 corresponding to the $j^{th}$ test subcircuit are respectively connected to input ends of $CO_j$ second gating circuits 307. Output ends of the $CO_j$ second gating circuits 307 are respectively connected to COj inputs of each second selector 308 of the M second selectors 308. Output ends of the $CI_j$ third selectors 309 are respectively connected to input ends of $CI_j$ first gate control circuits 306. Output ends of the $CI_j$ first gate control circuits 306 are respectively connected to $CI_j$ scan input channels channel_in of the tested circuit 01 corresponding to the $j^{th}$ test subcircuit.

Corresponding to Example 3 in FIG. 7A and FIG. 7B, in the $j^{th}$ test subcircuit of the plurality of test subcircuits 30 shown in FIG. 1, the OR gate 310 is connected to the scan input channel_in of the tested circuit 01 corresponding to the $j^{th}$ test subcircuit through the first gate control circuit 306, and is configured to control whether data in the data distribution circuit 301 is output to the scan input channel_in of the tested circuit 01 corresponding to the $j^{th}$ test subcircuit. The scan output channel channel_out of the tested circuit 01 corresponding to the $j^{th}$ test subcircuit is connected to the data distribution circuit 301 through the second gating circuit 307, and is configured to control whether data of the scan output channel channel_out of the tested circuit 01 corresponding to the $j^{th}$ test subcircuit is output to the data distribution circuit 301.

For example, output ends of the $CI_j$ OR gates 310 are respectively connected to input ends of $CI_j$ first gate control circuits 306. Output ends of the $CI_j$ first gate control circuits 306 are respectively connected to $CI_j$ scan input channels channel_in of the tested circuit 01 corresponding to the $j^{th}$ test subcircuit. The $CO_j$ scan output channels channel_out of the tested circuit 01 corresponding to the $j^{th}$ test subcircuit are respectively connected to the input ends of the $CO_j$ second gating circuits 307. The COj second gating circuits 307 are respectively corresponding to $CO_j$ groups of data distribution circuits 301. Second input ends of each data distribution circuit 301 in each group of data distribution circuits 301 are connected to output ends of a corresponding second gating circuit 307.

It should be understood that a corresponding gating circuit is disposed between the scan input channel_in of the tested circuit 01 and the data distribution circuit 301, and between the scan output channel_out of the tested circuit 01 and the data distribution circuit 301. Therefore, data can be transmitted between the data distribution circuit 301 and the scan input channel_in of the tested circuit 01 or between the scan output channel channel_out of the tested circuit 01 and the data distribution circuit 301 only when the corresponding gating circuit is enabled. This avoids transmission of invalid data.

For example, to facilitate the test of the tested circuit 01, some parameters need to be configured in the entire test process. For example, the test parameters are configured by using a state machine 304. Therefore, each test subcircuit 30 shown in FIG. 1 further includes a state machine 304. The state machine 304 is a finite state machine (FSM). The state machine 304 may include: a first state control interface, a second state control interface, a third state control interface, and a fourth state control interface. The state machine 304 is applicable to the examples described in FIG. 2A and FIG. 2B, FIG. 5A and FIG. 5B, FIG. 6A and FIG. 6B, FIG. 7A and FIG. 7B, and FIG. 9A and FIG. 9B.

The first state control interface is configured to generate an output capture enabling signal so_cap_en, transfer the output capture enabling signal so_cap_en to a first control end of each data distribution circuit 301 in each test subcircuit 30 shown in FIG. 1. The fourth selector 3011 is configured to control whether the data distribution circuit 301 receives scan test data of the test bus or receives scan output data of the tested circuit 01 at the current time.

The second state control interface is configured to generate a first gating enabling signal ch_in_gate_en, and configure the first gate control circuit 306 by using the first gating enabling signal ch_in_gate_en, to control whether the scan test data of each data distribution circuit 301 in the test subcircuit 30 shown in FIG. 1 is transmitted to the scan input channel channel_in of the corresponding tested circuit 01 in the test subcircuit 30 shown in FIG. 1.

The third state control interface is configured to generate a second gating enabling signal ch_out_gate_en, and configure the second gating circuit by using the second gating enabling signal ch_out_gate_en, to control whether the scan output data of the scan output channel channel_out of the corresponding tested circuit 01 in the test subcircuit 30 shown in FIG. 1 is transmitted to the data distribution circuit 301 corresponding to the tested circuit 01. (in FIG. 2A and FIG. 2B, FIG. 5A and FIG. 5B, FIG. 6A and FIG. 6B, FIG. 7A and FIG. 7B, and FIG. 9A and FIG. 9B, a signal identifier on an FSM side of the state machine is gate_en, and may correspond to ch_in_gate_en in the first gate control circuit 306 and ch_out_gate_en in the second gating circuit 307).

The fourth state control interface is configured to generate a scan enabling signal scan_enable, and configure a scan structure of the tested circuit 01 by using the scan enabling signal, to control whether to perform test scanning on the scan structure of the tested circuit 01 corresponding to the test subcircuit 30 shown in FIG. 1.

The finite state machine 304 generates the foregoing four types of signals to configure a test process of the test circuit. Configuration is simple and easy to implement.

Optionally, corresponding to the examples in FIG. 2A and FIG. 2B, FIG. 5A and FIG. 5B, FIG. 6A and FIG. 6B, FIG. 7A and FIG. 7B, and FIG. 9A and FIG. 9B, each test subcircuit 30 shown in FIG. 1 may further include a frequency dividing circuit 305. The frequency dividing circuit 305 may use a frequency divider (DIV). The frequency dividing circuit 305 is connected to a bus clock interface and a scan clock interface of the tested circuit 01 respectively, and is configured to divide a frequency of the test bus clock scanbus_clk into a scan clock scan_clock of the tested circuit 01. In the foregoing optional solution, a high-speed scan clock of the test bus is divided into a low-speed scan clock in the tested circuit 01, to facilitate a scan test on the tested circuit 01.

Figure 11:
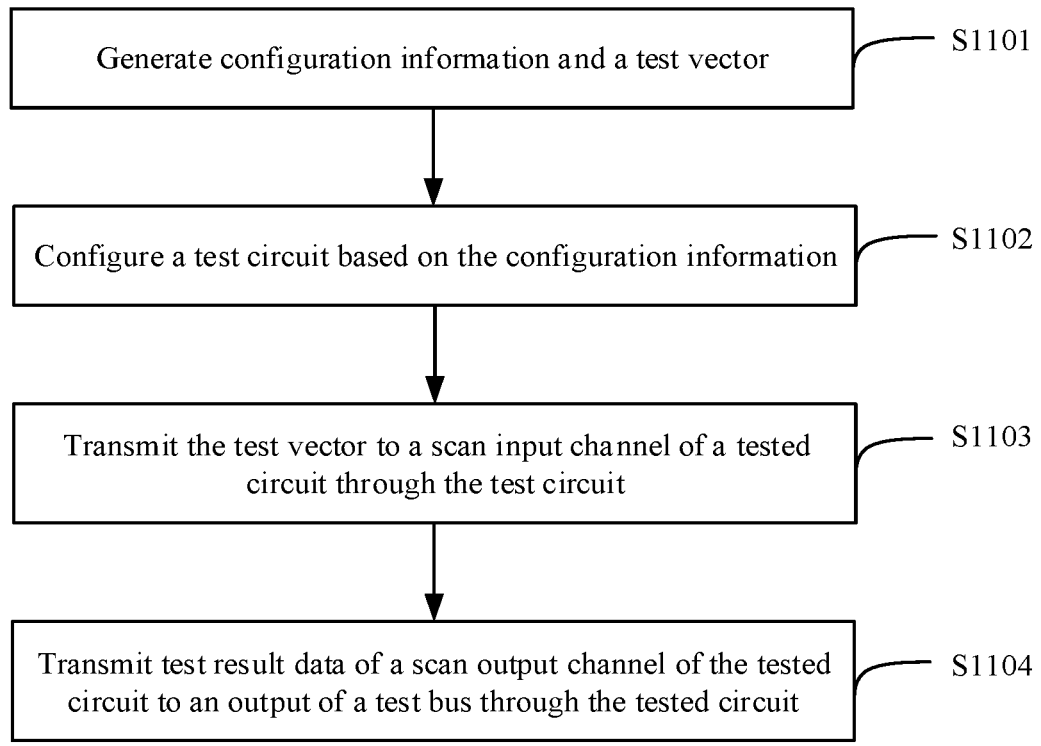
FIG. 11 is a flowchart of a circuit test method according to an embodiment of this application.

For example, FIG. 11 is a flowchart of a circuit test method according to an embodiment of this application. The circuit test method may be used to test the tested circuit in EDA software, and is applicable to testing the tested circuit by using any test circuit shown in FIG. 2A and FIG. 2B, FIG. 5A and FIG. 5B, FIG. 6A and FIG. 6B, FIG. 7A and FIG. 7B, and FIG. 9A and FIG. 9B.

Refer to FIG. 11. The circuit test method includes the following steps.

S1101: Generate configuration information and a test vector. It should be understood that the configuration information and the test vector may be generated by the EDA software. In a test process, the EDA software may generate the configuration information and test excitation data based on some test parameters given by a tester. The configuration information may be used to configure a test circuit. The test vector is the test excitation data of the tested circuit, and is determined by a circuit structure of the tested circuit.

S1102: Configure the test circuit based on the configuration information.

Before configuring the test circuit, circuits to be tested at the same time are specified. Therefore, the tested circuits can be tested by group. Generally, the tested circuits can be grouped based on a principle of shortest total test time.

When the test circuit is configured, a specific configuration method and configuration content vary based on different test circuit structures.

For example, in the test circuits shown in FIG. 2A and FIG. 2B, and FIG. 5A and FIG. 5B, the shift selection control signal bus_shift may be configured through the first signal interface of the controller 303, to control a connection relationship between an input and an output selected by the first selector 302. When the tested circuit does not participate in the test, the first selector in the test subcircuit corresponding to the tested circuit is set to a direct connection mode. In other words, the first selector 302 is configured to connect the first input end to the output end. The bypass enabling signal dru_bp may be configured through the second signal interface of the controller 303, so that the data distribution circuit in the test subcircuit corresponding to the tested circuit that does not participate in the test is set to a bypass state. In other words, no register is passed between the first input end and the second output end in the corresponding data distribution circuit 301.

In the test circuit shown in FIG. 6A and FIG. 6B, the scan output selection signal so_select and the scan input selection signal si_select may be configured through the controller 303. The scan output selection signal so_select is output through the third signal interface, and is used to configure the second selector 308, so that the scan output channel channel_out of the tested circuit 01 corresponding to the test subcircuit 30 shown in FIG. 1 is connected to a data distribution circuit 301 in the test subcircuit 30. The scan input selection signal is output through the fourth signal interface, and is used to configure the third selector 309, so that the test subcircuit 30 selects one of the data distribution circuits 301 to connect to the scan input channel channel_in of the tested circuit 01 corresponding to the test subcircuit 30.

In the test circuit shown in FIG. 7A and FIG. 7B, the bypass enabling signal dru_bp may be configured by using the second signal interface of the controller 303. The bypass enabling signal dru_bp may be used as a reset signal of the data distribution circuit. When the data distribution circuit 301 is reset, it indicates that the data distribution circuit 301 is not selected. Therefore, a value output by the first output end of the selected data distribution circuit 301 is an input value of the selected test bus 02. This implements a one-to-one correspondence between the test bus 02, the data distribution circuit 301, and a scan channel of the tested circuit 01 is implemented.

In the test circuit shown in FIG. 9A and FIG. 9B, the shift selection control signal bus_shift may be configured through the first signal interface of the controller 303, to control a connection relationship between an input and an output selected by the first selector 302. When the tested circuit does not participate in the test, the first selector 302 in the test subcircuit 30 shown in FIG. 1 corresponding to the tested circuit 01 is set to a direct connection mode. In other words, the first selector 302 is configured to connect the first input end to the output end.

In addition, in any test circuit shown in FIG. 2A and FIG. 2B, FIG. 5A and FIG. 5B, FIG. 6A and FIG. 6B, FIG. 7A and FIG. 7B, and FIG. 9A and FIG. 9B, the output capture enabling signal so_cap_en is further configured through the first state control interface of the state machine 304. The second state control interface of the state machine 304 is configured to output the first gating enabling signal ch_in_gate_en. The third state control interface of the state machine 304 is configured to output the second gating enabling signal ch_out_gate_en. The fourth state control interface of the state machine 304 is configured to output the scan enabling signal scan_enable. For functions of the output capture enabling signal so_cap_en, the first gating enabling signal ch_in_gate_en, the second gating enabling signal ch_out_gate_en, and the scan enabling signal scan_enable, refer to descriptions about the state machine in the example corresponding to FIG. 2A and FIG. 2B. Details are not described herein again.

In addition, in the configuration process, a frequency division ratio of the frequency dividing circuit 305 further needs to be configured. The frequency division ratio of the frequency dividing circuit 305 is determined by the quantity of scan input channels channel_in, the quantity of scan output channels channel_out, and the bit width of the test bus 02 of the tested circuit 01. A calculation formula of the frequency division ratio $R_{div}$ of the frequency dividing circuit 305 is:

$$R_{div} = \lceil \text{Max}(\Sigma CI_i, \Sigma CO_i)/B \rceil + 1.$$

$CI_i$ is a quantity of scan input channels of an $i^{th}$ tested circuit. $CO_i$ is a quantity of scan output channels of the $i^{th}$ tested circuit. B is a bit width of a bus.

S1103: Transmit the test vector to the test bus, and transmit the test vector to a scan input channel of the tested circuit through the test circuit. The test vector is the test excitation data of the tested circuit, and is determined by a circuit structure of the tested circuit.

The transmitting a test vector to the scan input channel of the tested circuit through the test circuit includes: transmitting the test vector to the scan input channel of the tested circuit based on a correspondence between the scan input channel of the tested circuit and an input of the test bus through the input of the test bus corresponding to the scan input channel of the tested circuit.

The correspondence between the scan input channel channel_in of the tested circuit and the input channel scanbus_in of the test bus 02 is determined by a data distribution circuit 301 in the test subcircuit 30 shown in FIG. 1 corresponding to the tested circuit 01.

For example, in the test circuits shown in FIG. 2A and FIG. 2B and FIG. 5A and FIG. 5B, the scan input channel_in of the tested circuit and the data distribution circuit 301 in the corresponding test subcircuit 30 shown in FIG. 1 are in a one-to-one correspondence. Therefore, the correspondence between the scan input channel channel_in of the tested circuit and the input channel scanbus_in of the test bus 02 is actually an actual connection relationship between the data distribution circuit 301 in the test subcircuit 30 shown in FIG. 1 corresponding to the tested circuit 01 and the test bus 02.

In the test circuit shown in FIG. 6A and FIG. 6B, the scan input channel channel_in of the tested circuit 01 and the data distribution circuit 301 in the test subcircuit 30 shown in FIG. 1 corresponding to the tested circuit 01 are in a one-to-many correspondence. Therefore, the correspondence between the scan input channel channel_in of the tested circuit and the input channel scanbus_in of the test bus may be configured by the scan input selection signal si_select configured by the controller 303. After configuration, the test bus 02 connected to the data distribution circuit 301 selected by the scan input channel channel_in of the tested circuit 01 corresponds to the scan input channel channel_in of the tested circuit 01.

In the test circuit shown in FIG. 7A and FIG. 7B, the scan input channel channel_in of the tested circuit 01 and the data distribution circuit 301 in the test subcircuit 30 shown in FIG. 1 corresponding to the tested circuit 01 are in a one-to-many correspondence. Therefore, the correspondence between the scan input channel channel_in of the tested circuit 01 and the input channel scanbus_in of the test bus 02 may be controlled by the bypass enabling signal dru_bp. The bypass enabling signal dru_bp may control the data distribution circuit 301 to reset. When the data distribution circuit 301 is not reset, the data distribution circuit 301 is selected by the scan input channel channel_in of the corresponding tested circuit 01. In other words, the correspondence between the scan input channel channel_in of the tested circuit 01 and the input channel scanbus_in of the test bus 02 is determined by the data distribution circuit 301 that is not reset.

S1104: Transmit test result data of the tested circuit to an output of the test bus through the tested circuit. Specifically, based on the correspondence between the scan output channel of the tested circuit and the output of the test bus, the test result data output by the scan output channel of the tested circuit is transmitted to the output of the test bus corresponding to the scan output channel of the tested circuit.

The correspondence between the scan output channel of the tested circuit and the output channel of the test bus is determined by the data distribution circuit in the test subcircuit corresponding to the tested circuit. The method for determining the correspondence between the scan output channel channel_out of the tested circuit 01 and the output channel scanbus_out of the test bus 02 is similar to the method for determining the correspondence between the scan input channel of the tested circuit and the input of the test bus in step S1103, and is not described herein again.

It should be noted that, when the test circuit tests the tested circuit, a plurality of tested circuits may be tested at the same time. However, the bit width of the test bus is limited. Therefore, the test bus is multiplexed. In other words, the test bus transmits data to scan input channels of the plurality of tested circuits through time sequence dividing. In a bus clock cycle, the test bus can transmit data to only one scan input channel or output data from only one scan output channel. Therefore, if the input of the test bus needs to transmit data to the plurality of scan input channels channel_in, or the output needs to output data from the plurality of scan output channels channel_out, the transmitted data is divided and transmitted in sequence in a plurality of bus clock cycles. For a specific example, refer to the test solution shown in FIG. 13A and FIG. 13B.

In addition, each time the test bus transmits scanning data of one cycle, one bus clock cycle is added, to transmit the test vector data in the data distribution circuit to the scan input channel channel_in of the tested circuit 01, and transmit the test result data of the scan output channel channel_out of the tested circuit 01 to the data distribution circuit. The scanning data in a period refers to the scan test data scanned once by all the tested circuits.

For the test method of the foregoing circuit, the following uses the test circuit shown in FIG. 2A and FIG. 2B as an example for description. In the example shown in FIG. 2A and FIG. 2B, it is assumed that the tested circuit A (core_A) and the tested circuit C (core_C) perform a scanning test at the same time, and the tested circuit B (core_B) is not tested temporarily. Because the tested circuit B is not tested, the first selector 302 in the test subcircuit corresponding to the tested circuit B is configured to be in a direct connection state by using the shift selection control signal bus_shift. In other words, in this example, the shift selection control signal bus_shift is set to 0, and the bypass enabling signal dru_bp that controls the bypass of the data distribution circuit 301 in the test subcircuit corresponding to the tested circuit B is set to 0. The first input end and the second output end of the data distribution circuit 301 are directly connected.

TABLE 1

| input | channels | | output |
|---|---|---|---|
| scanbus_in[0] | core_A.channel_in[0] | core_A.channel_out[0] | scanbus_out[1] |
| scanbus_in[1] | core_A.channel_in[1] | core_A.channel_out[1] | scanbus_out[2] |
| scanbus_in[2] | core_A.channel_in[2] | core_A.channel_out[2] | scanbus_out[3] |
| scanbus_in[3] | core_C.channel_in[0] | core_C.channel_out[0] | scanbus_out[4] |
| scanbus_in[4] | core_C.channel_in[1] | core_C.channel_out[1] | scanbus_out[5] |
| scanbus_in[5] | core_C.channel_in[2] | core_C.channel_out[2] | scanbus_out[6] |
| scanbus_in[6] | core_C.channel_in[3] | core_C.channel_out[3] | scanbus_out[7] |
| scanbus_in[7] | / | / | scanbus_out[0] |

Figure 12A:
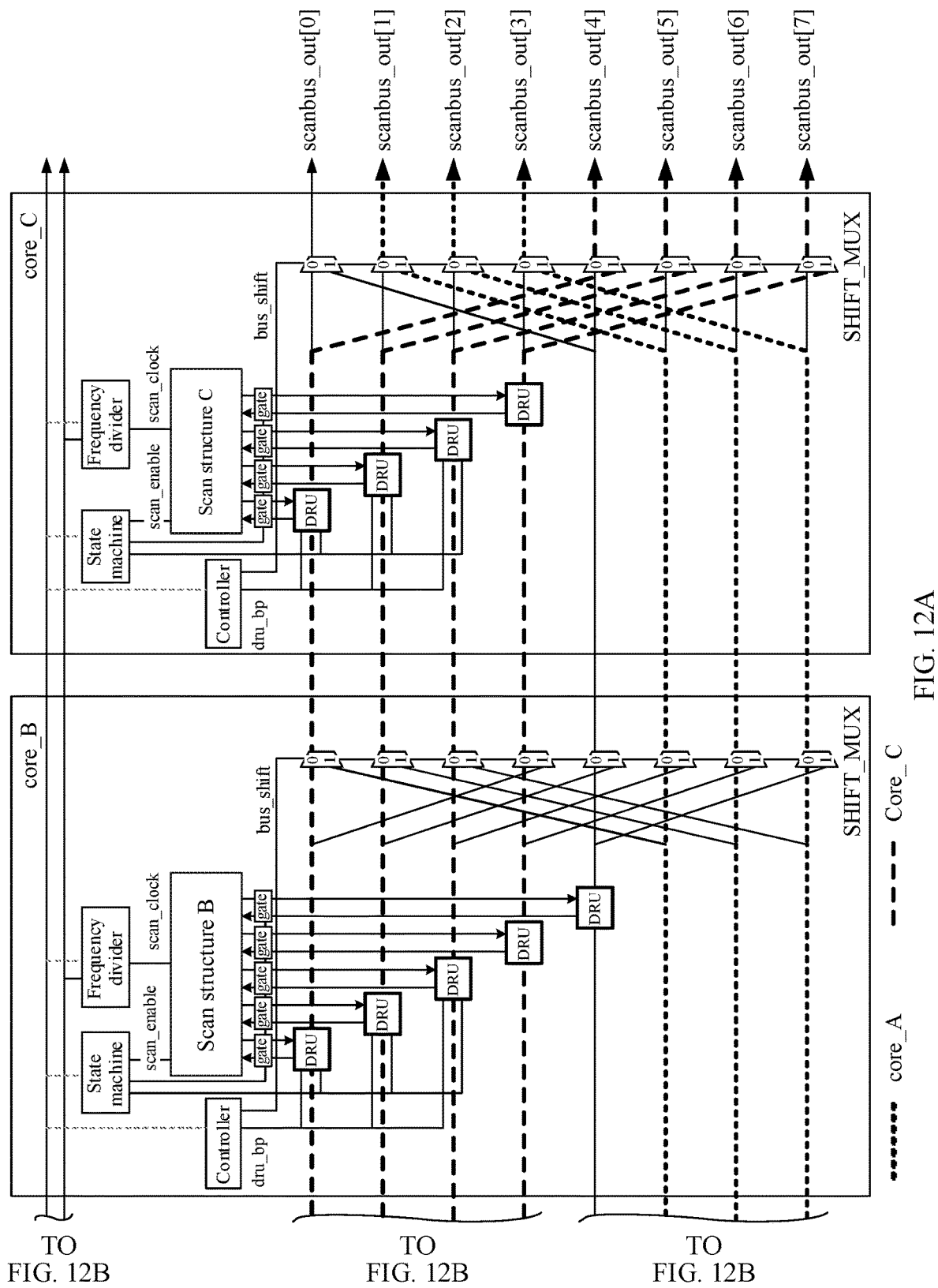
FIG. 12A and FIG. 12B are a schematic diagram of a structure of a test solution corresponding to FIG. 2A and FIG. 2B.
Figure 12B:
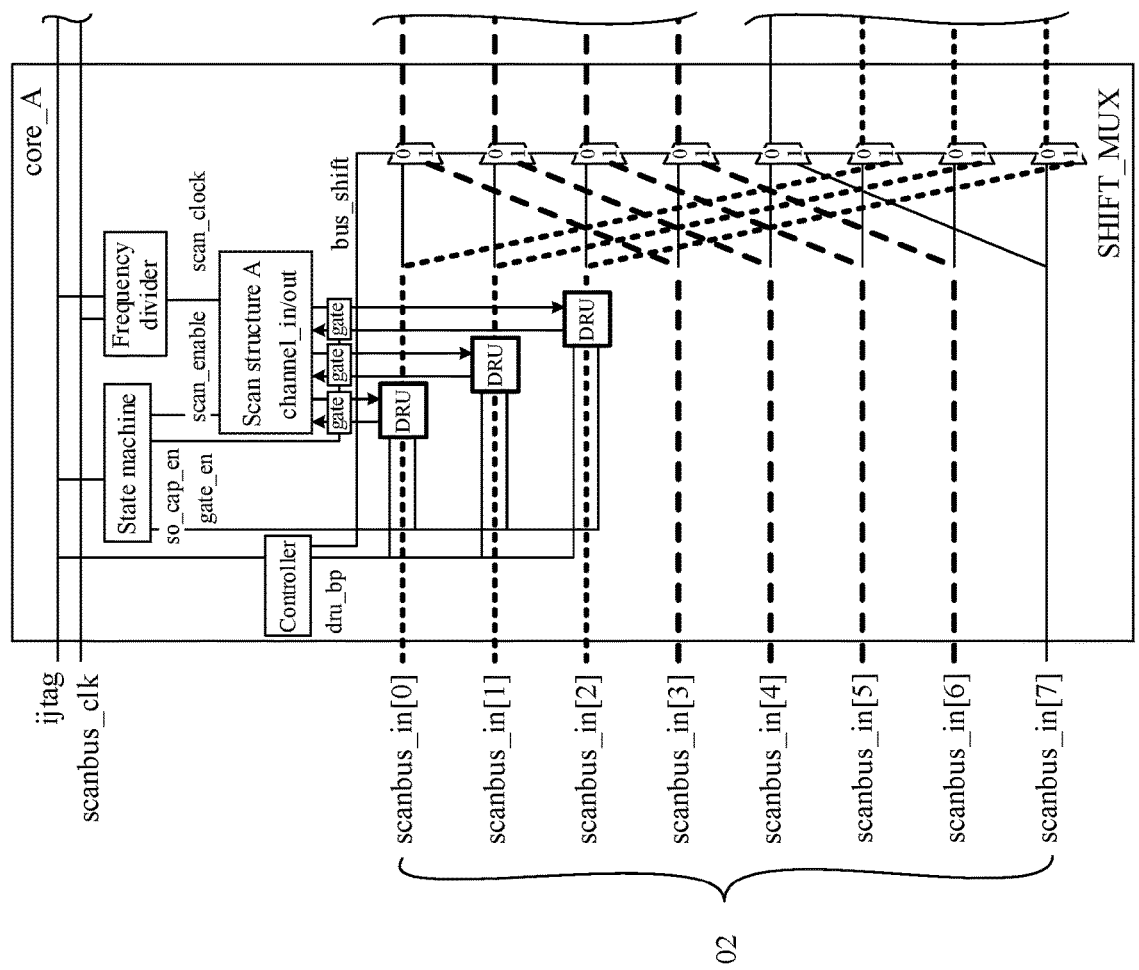

Refer to the test solution shown in FIG. 12A and FIG. 12B. FIG. 12A and FIG. 12B are a schematic diagram of a structure of a test solution corresponding to FIG. 2A and FIG. 2B in this embodiment. According to test bus resource allocation shown in FIG. 12A and FIG. 12B, a scan test is performed on the tested circuit A and the tested circuit C at the same time. The tested circuit B is not tested temporarily. For the correspondence between the test bus 02 and a scan channel of the tested circuit 01, refer to Table 1.

According to the correspondence between the test bus 02 and the scan channel of the tested circuit 01 in Table 1, the test vector is transmitted to the scan input channel of the tested circuit through the input channel scanbus_in of the test bus. The test result data is transmitted from the scan output channel of the tested circuit to the output channel scanbus_out of the test bus. Each input or output of the test bus corresponds to only one scan channel of the tested circuit. Therefore, the test vector and test result data can be transmitted in one period.

Figure 13B:
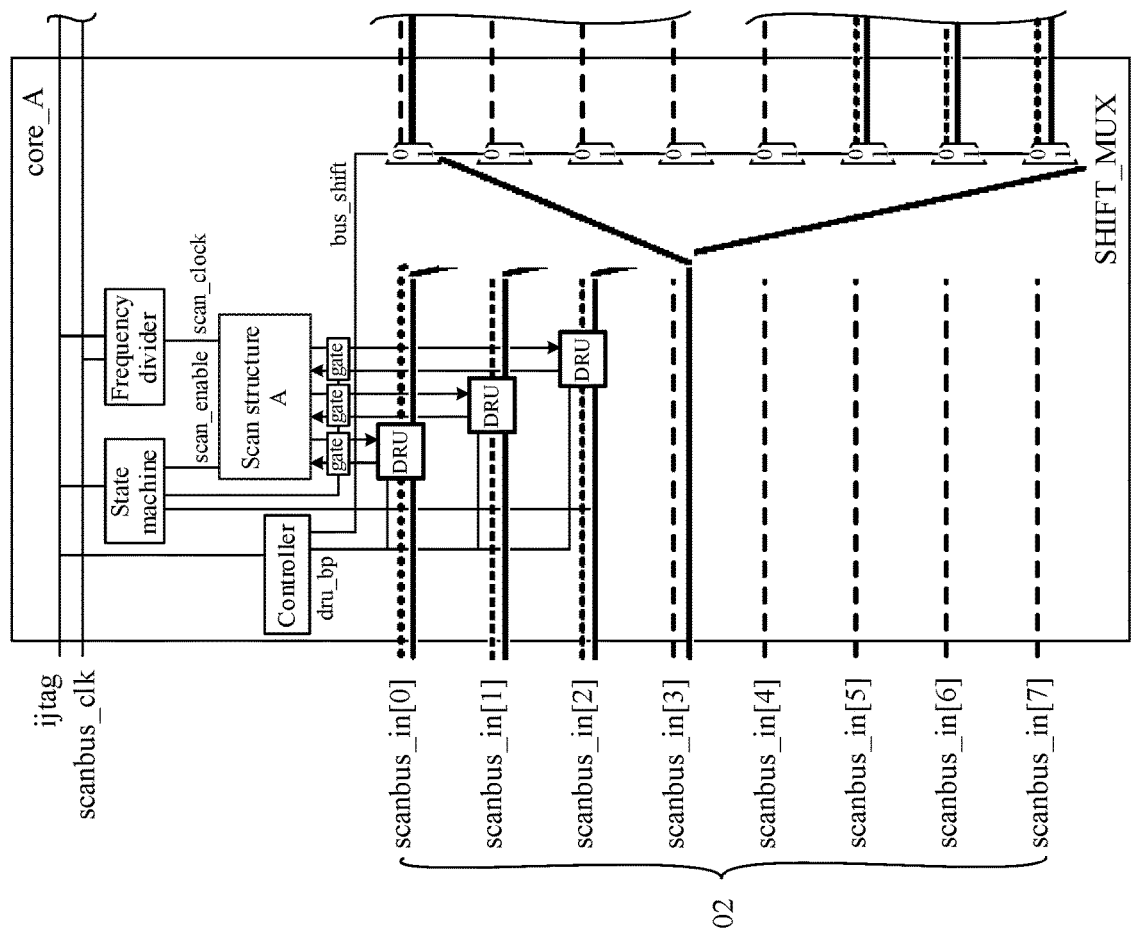

In the example shown in FIG. 2A and FIG. 2B, it is assumed that the tested circuit A (core_A), the tested circuit B (core_B), and the tested circuit C (core_C) are tested at the same time. Refer to the test solution shown in FIG. 13A and FIG. 13B. FIG. 13A and FIG. 13B are a schematic diagram of a structure of another test solution corresponding to FIG. 2A and FIG. 2B in this embodiment.

In this example, a bit width of the test bus 02 is 8 bits. The tested circuit A has three scan channels. The tested circuit B has five scan channels. The tested circuit C has four scan channels. The quantity of scan channels is a maximum value between the quantity of scan input channels and the quantity of scan output channels of the tested circuit. Therefore, for allocation of the test bus, the tested circuit A needs to allocate three-bit input and output of the test bus. The tested circuit B needs to allocate five-bit input and output of the test bus. In other words, the tested circuit A and the tested circuit B have occupied all resources of the test bus. The tested circuit C can only multiplex the test bus, and input or output the test vector data and test result data in two different clock cycles. For a correspondence between the test bus 02 and the scan input channel of the tested circuit 01, refer to Table 2. channel[x] in Table 2 may represent channel_in[x] or channel_out[x] in FIG. 2A and FIG. 2B, and x is an integer representing a quantity of bits. For example, during data transmission of test vector input, channel[x] in Table 2 represents channel_in[x]. During transmission of test result data, channel[x] in Table 2 represents channel_out [x].

TABLE 2

| input | Cycle1 | Cycle2 | output |
|---|---|---|---|
| scanbus_in[0] | core_C.channel[0] | core_A.channel[0] | scanbus_out[4] |
| scanbus_in[1] | core_C.channel[1] | core_A.channel[1] | scanbus_out[5] |
| scanbus_in[2] | core_C.channel[2] | core_A.channel[2] | scanbus_out[6] |
| scanbus_in[3] | core_C.channel[3] | core_B.channel[0] | scanbus_out[7] |
| scanbus_in[4] | / | core_B.channel[1] | scanbus_out[0] |
| scanbus_in[5] | / | core_B.channel[2] | scanbus_out[1] |
| scanbus_in[6] | / | core_B.channel[3] | scanbus_out[2] |
| scanbus_in[7] | / | core_B.channel[4] | scanbus_out[3] |

Figure 14:
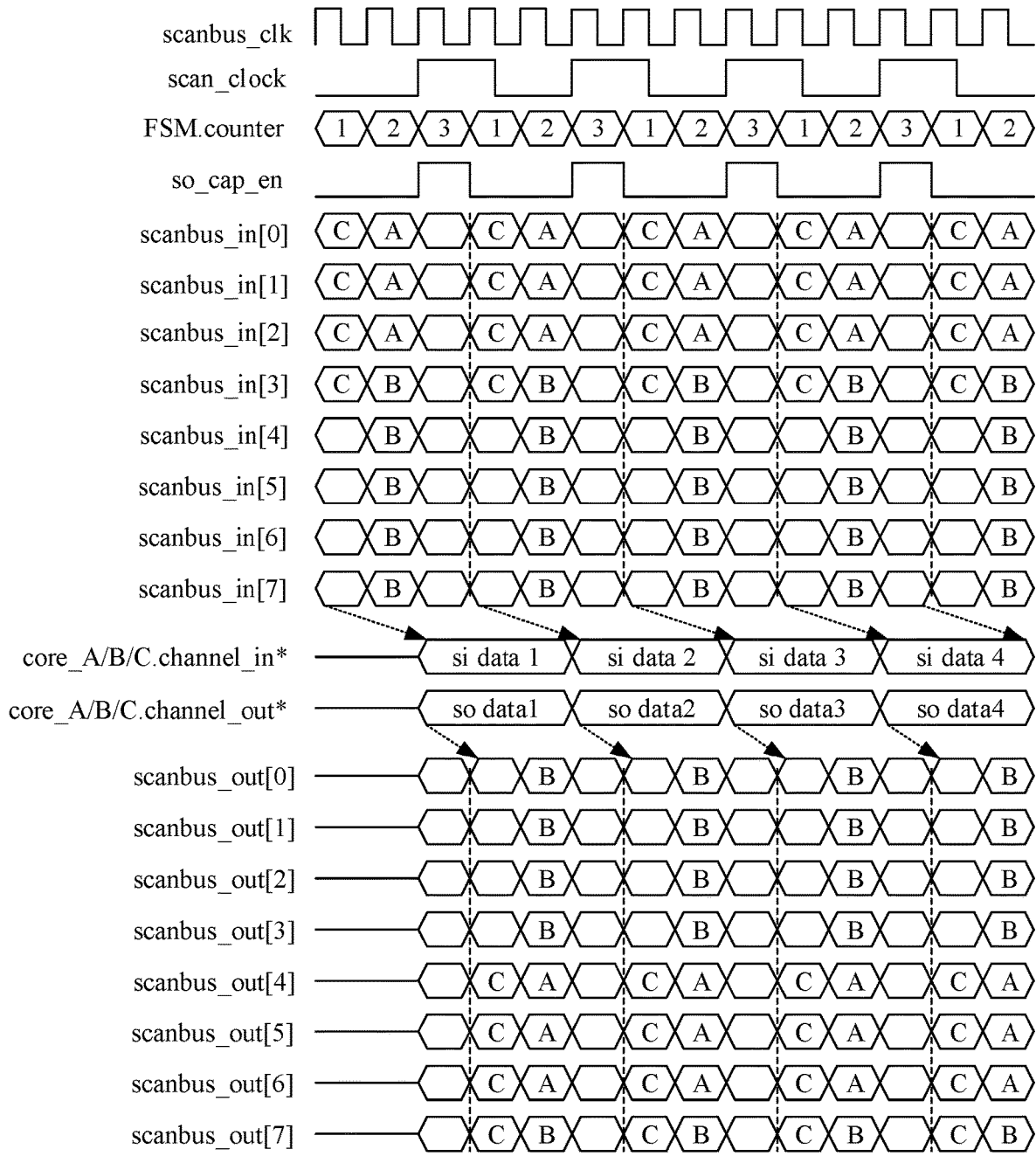
FIG. 14 is a schematic waveform diagram of a scanning procedure of a test solution corresponding to FIG. 13A and FIG. 13B.
Figure 15:
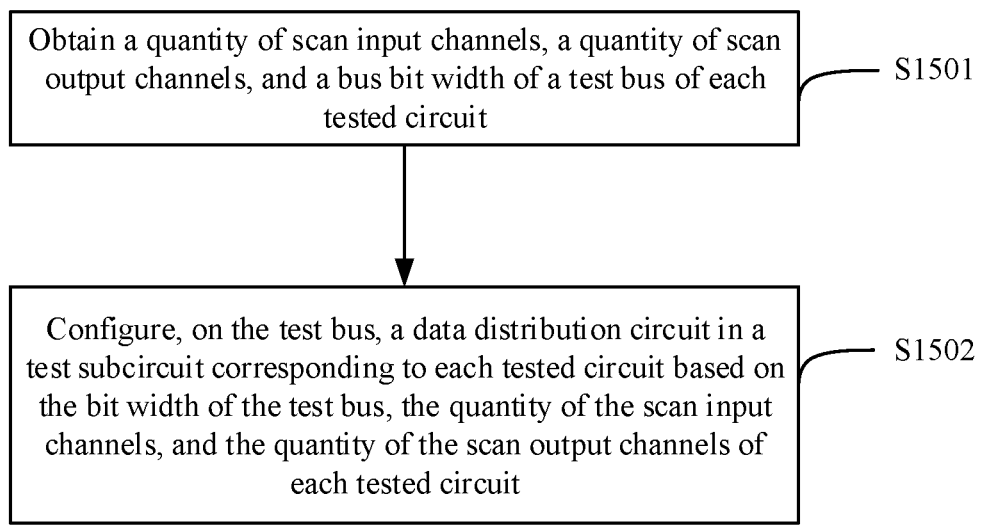
FIG. 15 is a flowchart of a test circuit design method according to an embodiment of this application.

In the test solution shown in FIG. 13A and FIG. 13B, a test is performed according to the test method shown in FIG. 15, and a finally obtained test waveform diagram is shown in FIG. 14.

It should be noted that the test solution shown in FIG. 13A and FIG. 13B is merely an example. During actual testing of the tested circuit, the quantity of scan channels of one tested circuit may exceed the bit width of the test bus. In this case, the quantity of the scan input channels channel_in of the tested circuit 01 corresponding to one input channel scanbus_in of the test bus 02 may exceed one. The quantity of the scan input channels channel_out of the tested circuit 01 corresponding to one output channel scanbus_out of the test bus 02 may also exceed one. In this case, data also needs to be transmitted in a plurality of bus clock cycles in a time sequence dividing manner.

For example, FIG. 15 is a flowchart of a test circuit design method according to an embodiment of this application.

Refer to FIG. 15. The method test circuit design method includes the following steps.

S1501: Obtain a quantity of scan input channels, a quantity of scan output channels, and a bus bit width of a test bus of each tested circuit.

S1502: Configure, on the test bus, a data distribution circuit in a test subcircuit corresponding to each tested circuit based on the bit width of the test bus, the quantity of the scan input channels, and the quantity of the scan output channels of each tested circuit, and generate any test circuit shown in FIG. 2A and FIG. 2B, FIG. 5A and FIG. 5B, FIG. 6A and FIG. 6B, FIG. 7A and FIG. 7B, and FIG. 9A and FIG. 9B.

A quantity of data distribution circuits in the test subcircuit corresponding to each tested circuit is determined by the bit width of the test bus, or the quantity of the scan input channels and the quantity of the scan output channels of each tested circuit.

In the examples in FIG. 2A and FIG. 2B and FIG. 5A and FIG. 5B, the quantity of the data distribution circuits 301 in the test subcircuit 30 shown in FIG. 1 corresponding to each tested circuit 01 is associated with the quantity of the scan input channels channel_in and the quantity of the scan output channels channel_out in the tested circuit 01, that is, is equal to a maximum value of the quantity of the scan input channels channel_in and the quantity of the scan output channels channel_out in the corresponding tested circuit.

An embodiment of this application further provides a computer-readable storage medium. The computer storage medium stores computer-readable instructions. When a computer reads and executes the computer-readable instructions, the computer is enabled to perform the circuit test method in the method embodiment shown in FIG. 11.

An embodiment of this application further provides a computer program product. When a computer reads and executes the computer program product, the computer is enabled to perform the circuit test method in the method embodiment shown in FIG. 11.

It should be understood that, the processor in embodiments of this application may be a central processing unit (CPU), or may be another general-purpose processor, a digital signal processor (DSP), an application-specific integrated circuit (ASIC), a field programmable gate array (FPGA) or another programmable logic device, a discrete gate or a transistor logic device, a discrete hardware component, or the like. The general-purpose processor may be a microprocessor, or the processor may be any conventional processor or the like.

It may be understood that the memory in embodiments of this application may be a volatile memory or a nonvolatile memory, or may include a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), used as an external cache. Through an example rather than a limitative description, random access memories (RAM) in many forms may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DRRAM).

All or some of the foregoing embodiments may be implemented using software, hardware (for example, circuit), firmware, or any combination thereof. When software is used to implement embodiments, the foregoing embodiments may be implemented completely or partially in a form of a computer program product. The computer program product includes one or more computer instructions or computer programs. When the program instructions or the computer programs are loaded and executed on the computer, the procedure or functions according to embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), or a semiconductor medium. The semiconductor medium may be a solid-state drive.

The foregoing descriptions are merely specific implementations of this application, but the protection scope of this application is not limited thereto. Any variation or replacement that can be readily figured out by the person skilled in the art within the technical scope disclosed in this application shall fall within the protection scope of this application. Therefore, the protection scope of this application shall be subject to the protection scope of the claims.

What is claimed is:

1. A test circuit, comprising:
a plurality of test subcircuits configured to respectively connect a corresponding plurality of tested circuits to a test bus;
a $j^{th}$ test subcircuit in the plurality of test subcircuits comprises Nj data distribution circuits and M first selectors, wherein Nj and M are both positive integers, M is equal to a bit width of the test bus, and M is greater than or equal to Nj;
in the $j^{th}$ test subcircuit, first input ends of the Nj data distribution circuits are respectively connected to Nj inputs of the test bus, first output ends of the Nj data distribution circuits are connected to a scan input channel of the tested circuit corresponding to the $j^{th}$ test subcircuit, and second input ends of the Nj data distribution circuits are connected to a scan output channel of the tested circuit corresponding to the $j^{th}$ test subcircuit;
in the $j^{th}$ test subcircuit, output ends of the M first selectors are respectively connected to M outputs of the test bus;
first input ends of Nj first selectors of the M first selectors are respectively connected to second output ends of the Nj data distribution circuits, and first input ends of remaining M-Nj first selectors are respectively connected to inputs of M-Nj test buses on which no data distribution circuit is disposed;
second input ends of Nj first selectors of the M first selectors are respectively connected to the second output ends of the Nj data distribution circuits, and second input ends of the remaining M-Nj first selectors are respectively connected to the inputs of the M-Nj test buses on which no data distribution circuit is disposed; and
a first input end and a second input end of each of the M-Nj first selectors connects to a different test bus.

2. The test circuit according to claim 1, wherein in the $j^{th}$ test subcircuit of the plurality of test subcircuits, based on a preset test bus sequence, the first input ends of the Nj data distribution circuits are sequentially connected to inputs of first Nj test buses;
first input ends of first Nj first selectors are sequentially connected to the second output ends of the Nj data distribution circuits, and first input ends of last M-Nj first selectors are sequentially connected to last M-Nj inputs of the test bus; and
second input ends of first M-Nj first selectors are sequentially connected to the last M-Nj inputs of the test bus, and second input ends of last Nj first selectors are sequentially connected to the second output ends of the Nj data distribution circuits.

3. The test circuit according to claim 2, wherein the preset test bus sequence is a sequence or a reverse sequence of a bit sequence of a test bus.

4. The test circuit according to claim 1, wherein first output ends of $CI_j$ data distribution circuits in the Nj data distribution circuits are respectively connected to $CI_j$ scan input channels of the tested circuit corresponding to the $j^{th}$ test subcircuit, second input ends of $CO_j$ data distribution circuits in the Nj data distribution circuits are respectively connected to $CO_j$ scan output channels of the tested circuit corresponding to the $j^{th}$ test subcircuit, and Nj=Max ($CI_j$, $CO_j$).

5. The test circuit according to claim 1, wherein each data distribution circuit comprises a fourth selector, a register, and a fifth selector;
a first input end and a second input end of the fourth selector are respectively connected to a first input end and a second input end of the data distribution circuit;
an input end of the register is connected to an output end of the fourth selector, and an output end of the register is connected to a first input end of the fifth selector;
a second input end of the fifth selector is connected to the first input end of the data distribution circuit, and an output end of the fifth selector is connected to a second output end of the data distribution circuit; and
a first output end of the data distribution circuit is connected to the first input end of the data distribution circuit, the output end of the register, or the second output end of the data distribution circuit.

6. The test circuit according to claim 5, wherein each test subcircuit further comprises a controller, and the controller comprises:

a first signal interface, configured to control the first input end of a first selector to connect to an output end, or the second input end of the first selector to connect to the output end; and a second signal interface, configured to control the first input end and the second output end of the data distribution circuit to be directly connected or connected through the register.

7. The test circuit according to claim 1, wherein in the $j^{th}$ test subcircuit of the plurality of test subcircuits, the data distribution circuit is connected to the scan input channel of the tested circuit corresponding to the $j^{th}$ test subcircuit through a first gate control circuit, and is configured to control whether data in the data distribution circuit is output to the scan input channel of the tested circuit corresponding to the $j^{th}$ test subcircuit; and the data distribution circuit is connected to the scan output channel of the tested circuit corresponding to the $j^{th}$ test subcircuit through a second gating circuit, and is configured to control whether data of the scan output channel of the tested circuit corresponding to the $j^{th}$ test subcircuit is output to the data distribution circuit.

8. The test circuit according to claim 7, wherein each test subcircuit further comprises a state machine, and the state machine comprises:

a first state control interface, configured to generate an output capture enabling signal, and control each data distribution circuit in the test subcircuit whether to receive scan output data of the tested circuit;

a second state control interface, configured to generate a first gating enabling signal, and control whether data of each data distribution circuit in the test subcircuit is transmitted to a scan input channel of a corresponding tested circuit in the test subcircuit;

a third state control interface, configured to generate a second gating enabling signal, and control whether data of a scan output channel of a corresponding tested circuit in the test subcircuit is transmitted to the data distribution circuit in the tested circuit; and a fourth state control interface, configured to generate a scan enabling signal, and configured to control whether to perform test scanning on a scan structure of the tested circuit corresponding to the test subcircuit.

9. The test circuit according to claim 1, wherein the test circuit is disposed inside or outside the tested circuit.

10. The test circuit according to claim 1, wherein each test subcircuit further comprises a frequency dividing circuit, and the frequency dividing circuit is connected to a bus clock interface and a scan clock interface of the tested circuit respectively, and is configured to classify a clock of the test bus as a scan clock of the tested circuit.

11. An integrated circuit, comprising a plurality of tested circuits, a test bus, and the test circuit comprises:

a plurality of test subcircuits configured to respectively connect the plurality of tested circuits to a test bus;

a $j^{th}$ test subcircuit in the plurality of test subcircuits comprises Nj data distribution circuits and M first selectors, wherein Nj and M are both positive integers, M is equal to a bit width of the test bus, and M is greater than or equal to Nj;

in the $j^{th}$ test subcircuit, first input ends of the Nj data distribution circuits are respectively connected to Nj inputs of the test bus, first output ends of the Nj data distribution circuits are connected to a scan input channel of the tested circuit corresponding to the $j^{th}$ test subcircuit, and second input ends of the Nj data distribution circuits are connected to a scan output channel of the tested circuit corresponding to the $j^{th}$ test subcircuit;

in the $j^{th}$ test subcircuit, output ends of the M first selectors are respectively connected to M outputs of the test bus;

first input ends of Nj first selectors of the M first selectors are respectively connected to second output ends of the Nj data distribution circuits, and first input ends of remaining M-Nj first selectors are respectively connected to inputs of M-Nj test buses on which no data distribution circuit is disposed;

second input ends of Nj first selectors of the M first selectors are respectively connected to the second output ends of the Nj data distribution circuits, and second input ends of the remaining M-Nj first selectors are respectively connected to the inputs of the M-Nj test buses on which no data distribution circuit is disposed; and a first input end and a second input end of each of the M-Nj first selectors connects to a different test bus; and the plurality of tested circuits are connected to the test bus through a plurality of test subcircuits corresponding to the tested circuit in the test circuit.

12. The integrated circuit according to claim 11, wherein in the $j^{th}$ test subcircuit of the plurality of test subcircuits, based on a preset test bus sequence, the first input ends of the Nj data distribution circuits are sequentially connected to inputs of first Nj test buses;

first input ends of first Nj first selectors are sequentially connected to the second output ends of the Nj data distribution circuits, and first input ends of last M-Nj first selectors are sequentially connected to last M-Nj inputs of the test bus; and second input ends of first M-Nj first selectors are sequentially connected to the last M-Nj inputs of the test bus, and second input ends of last Nj first selectors are sequentially connected to the second output ends of the Nj data distribution circuits.

13. The integrated circuit according to claim 12, wherein the preset test bus sequence is a sequence or a reverse sequence of a bit sequence of a test bus.

14. The integrated circuit according to claim 11, wherein first output ends of $CI_j$ data distribution circuits in the Nj data distribution circuits are respectively connected to $CI_j$ scan input channels of the tested circuit corresponding to the $j^{th}$ test subcircuit, second input ends of $CO_j$ data distribution circuits in the Nj data distribution circuits are respectively connected to $CO_j$ scan output channels of the tested circuit corresponding to the $j^{th}$ test subcircuit, and Nj=Max ($CI_j$, $CO_j$).

15. A circuit test method performed by a test circuit, wherein the test circuit comprises:

a plurality of test subcircuits configured to respectively connect a corresponding plurality of tested circuits to a test bus;

a $j^{th}$ test subcircuit in the plurality of test subcircuits comprises Nj data distribution circuits and M first selectors, wherein Nj and M are both positive integers, M is equal to a bit width of the test bus, and M is greater than or equal to Nj;

in the $j^{th}$ test subcircuit, first input ends of the Nj data distribution circuits are respectively connected to Nj inputs of the test bus, first output ends of the Nj data distribution circuits are connected to a scan input channel of the tested circuit corresponding to the $j^{th}$ test subcircuit, and second input ends of the Nj data distribution circuits are connected to a scan output channel of the tested circuit corresponding to the $j^{th}$ test subcircuit;

in the $j^{th}$ test subcircuit, output ends of the M first selectors are respectively connected to M outputs of the test bus;

first input ends of Nj first selectors of the M first selectors are respectively connected to second output ends of the Nj data distribution circuits, and first input ends of remaining M-Nj first selectors are respectively connected to inputs of M-Nj test buses on which no data distribution circuit is disposed;

second input ends of Nj first selectors of the M first selectors are respectively connected to the second output ends of the Nj data distribution circuits, and second input ends of the remaining M-Nj first selectors are respectively connected to the inputs of the M-Nj test buses on which no data distribution circuit is disposed; and a first input end and a second input end of each of the M-Nj first selectors connects to a different test bus;

the method comprises:

generating configuration information and a test vector; and the configuration information is used to configure the test circuit, and the test vector is test excitation data of the tested circuit and is determined by a circuit structure of the tested circuit.

16. The circuit test method according to claim 15, wherein the method further comprises:

configuring the test circuit based on the configuration information;

transmitting the test vector to a test bus, and transmitting the test vector to a scan input channel of the tested circuit through the test circuit; and transmitting test result data of the tested circuit to an output of the test bus through the tested circuit.

17. The circuit test method according to claim 16, wherein the transmitting the test vector to a test bus, and transmitting the test vector to a scan input channel of the tested circuit through the test circuit comprises:

transmitting the test vector to the scan input channel of the tested circuit based on a correspondence between the scan input channel of the tested circuit and an input of the test bus through the input of the test bus corresponding to the scan input channel of the tested circuit; and the correspondence between the scan input channel of the tested circuit and the input of the test bus is determined by a data distribution circuit in a test subcircuit corresponding to the tested circuit.

18. The circuit test method according to claim 17, wherein the transmitting test result data of the tested circuit to an output of the test bus through the tested circuit comprises:

transmitting the test result data output by a scan output channel of the tested circuit to the output of the test bus corresponding to the scan output channel of the tested circuit based on a correspondence between the scan output channel of the tested circuit and the output of the test bus; and the correspondence between the scan output channel of the tested circuit and the output of the test bus is determined by a data distribution circuit in a test subcircuit corresponding to the tested circuit.

19. The circuit test method according to claim 17, wherein the transmitting the test vector to the scan input channel of the tested circuit based on a correspondence between the scan input channel of the tested circuit and an input of the test bus through the input of the test bus corresponding to the scan input channel of the tested circuit comprises:

transmitting, by the test bus, the test vector to the scan input channel of the tested circuit in sequence in a plurality of bus clock cycles, wherein a quantity of scan input channels of the tested circuit corresponding to one input of the test bus exceeds one.

20. The circuit test method according to claim 18, wherein the transmitting the test result data output by a scan output channel of the tested circuit to the output of the test bus corresponding to the scan output channel of the tested circuit based on a correspondence between the scan output channel of the tested circuit and the output of the test bus comprises:

transmitting, by the test bus, the test result data in the scan output channel of the tested circuit to the output of the test bus in sequence in a plurality of clock cycles, wherein a quantity of scan output channels of the tested circuit corresponding to one output of the test bus exceeds one.

* * * * *